US012777629B2

(12) United States Patent
Sharma et al.

(10) Patent No.: US 12,777,629 B2
(45) Date of Patent: Oct. 27, 2026

(54) SCALED GAIN CELL ENHANCED AT LOW TEMPERATURES

(71) Applicant: Intel Corporation, Santa Clara, CA (US)

(72) Inventors: Abhishek Anil Sharma, Portland, OR (US); Sagar Suthram, Portland, OR (US); Wilfred Gomes, Portland, OR (US); Anand Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 266 days.

(21) Appl. No.: 17/856,879

(22) Filed: Jul. 1, 2022

(65) Prior Publication Data

US 2024/0008244 A1 Jan. 4, 2024

(51) Int. Cl.
*H10B 12/00* (2023.01)

(52) U.S. Cl.
CPC .................................... *H10B 12/00* (2023.02)

(58) Field of Classification Search
CPC ......... H10B 12/00; H10B 41/70; H10B 41/35
See application file for complete search history.

(56) References Cited

U.S. PATENT DOCUMENTS

| | | | | |
|---|---|---|---|---|
| 2020/0342932 | A1* | 10/2020 | Bennett | G11C 11/4096 |
| 2021/0166751 | A1* | 6/2021 | Teman | G11C 11/405 |
| 2022/0117114 | A1* | 4/2022 | Farias Moguel | H05K 7/20236 |
| 2023/0352070 | A1* | 11/2023 | Uchida | H10B 61/22 |
| 2023/0402521 | A1* | 12/2023 | Lin | H10D 62/121 |
| 2024/0062811 | A1* | 2/2024 | Giterman | G11C 8/16 |

* cited by examiner

*Primary Examiner* — Shaun M Campbell

(74) *Attorney, Agent, or Firm* — Essential Patents Group, LLP

(57) ABSTRACT

Bits are stored in cells having two transistors between two parallel bitlines. In a memory array, first and second transistor channels in a bit cell are parallel and offset and coupled to first and second bitlines, respectively, which are also parallel and offset. Adjacent bit cells share corresponding transistor channel structures. The transistor channels may be orthogonal to the bitlines. The memory array may be on an integrated circuit (IC) die, which may be coupled to a power supply in an IC system. In an IC system, the memory array may be coupled to a power supply and a cooling structure.

22 Claims, 12 Drawing Sheets

101

SCALED GAIN CELL ENHANCED AT LOW TEMPERATURES

BACKGROUND

Memory performance and cost pressures drive a continuous and ever-increasing demand for denser and cheaper memory devices. Density improvements in random-access memory (RAM) devices could readily improve and enable larger and more complex devices. For example, system performance can be improved by using denser RAM in place of other less-dense or more-volatile memory devices. More complex systems can be made better or less expensive with denser and cheaper memory devices.

Structures and methods are needed to improve memory devices and the larger systems in which the RAM devices are deployed. It is with respect to these and other considerations that the present improvements have been needed. Such improvements may become critical as the desire to improve memory become even more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity or other illustrative purpose. Further, where considered appropriate, reference labels have been repeated among the figures to indicate corresponding or analogous elements, e.g., with the same or similar functionality. The disclosure will be described with additional specificity and detail through use of the accompanying drawings.

DETAILED DESCRIPTION

Figure 1:
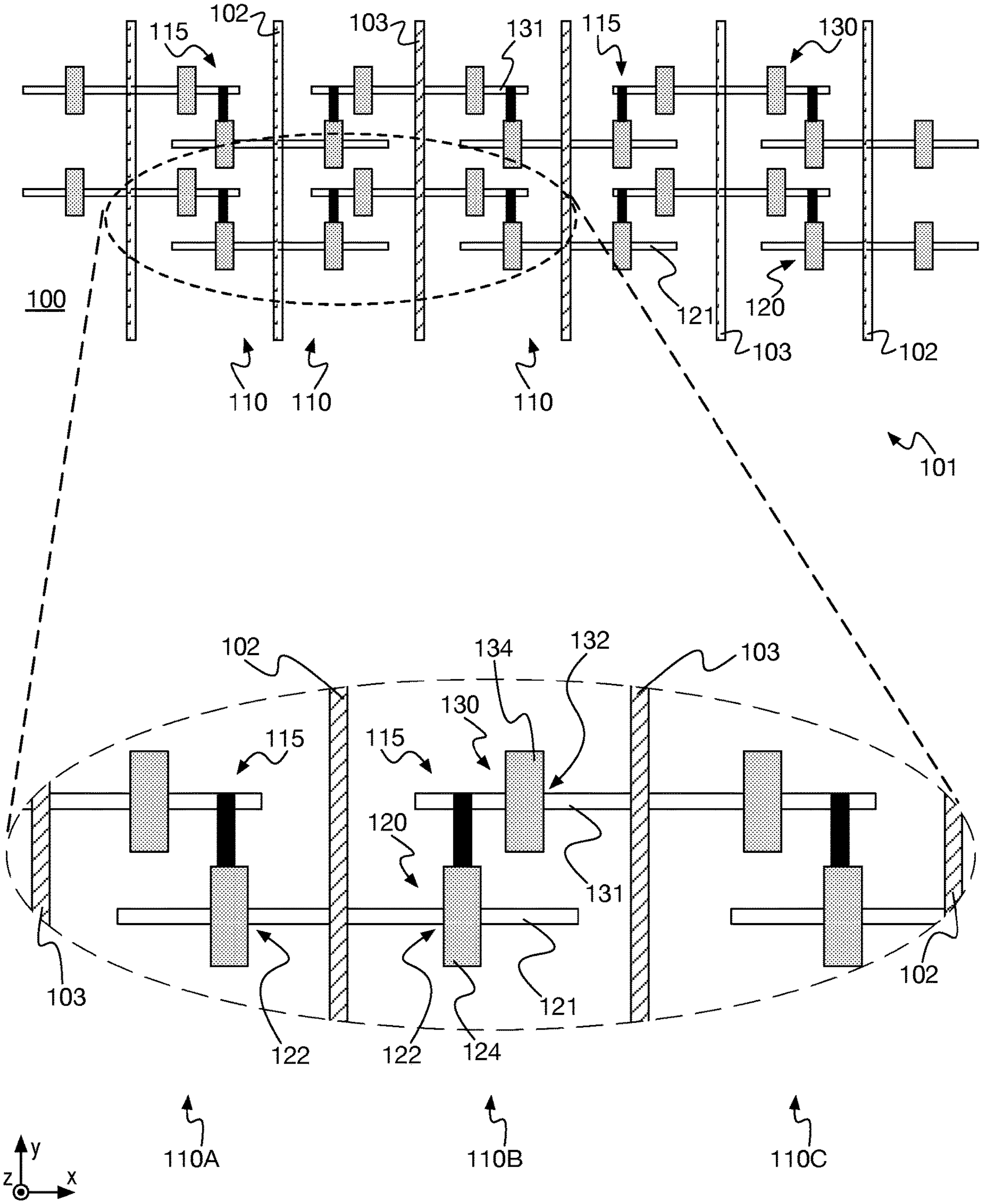
FIG. 1 illustrates a plan view of a memory device in an integrated circuit (IC) die, including scaled bit cells with staggered read and write transistors and parallel, offset channel structures.

In the following detailed description, reference is made to the accompanying drawings that show, by way of illustration, specific embodiments in which the claimed subject matter may be practiced. These embodiments are described in sufficient detail to enable those skilled in the art to practice the subject matter. The various embodiments, although different, are not necessarily mutually exclusive. For example, a particular feature, structure, or characteristic described herein, in connection with one embodiment, may be implemented within other embodiments without departing from the spirit and scope of the claimed subject matter.

References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled.

The terms "over," "to," "between," and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "coupled" and "connected," along with their derivatives, may be used herein to describe structural relationships between components. These terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up, i.e. scaling down, or scaling up, respectively) of a signal frequency relative to another parameter, for example, power supply level.

The vertical orientation is in the z-direction and recitations of "top," "bottom," "above," and "below" refer to relative positions in the z-dimension with the usual meaning. However, embodiments are not necessarily limited to the orientations or configurations illustrated in the figure. The term "aligned" (i.e., vertically or laterally) indicates at least a portion of the components are aligned in the pertinent direction while "fully aligned" indicates an entirety of the components are aligned in the pertinent direction.

The terms "substantially," "close," "approximately," "near," and "about," generally refer to being within +/−10% of a target value (unless specifically specified). Unless otherwise specified in the specific context of use, the term "predominantly" means more than 50%, or more than half. For example, a composition that is predominantly a first constituent means more than half of the composition is the first constituent. The term "primarily" means the most, or greatest, part. For example, a composition that is primarily a first constituent means the composition has more of the first constituent than any other constituent. A composition that is primarily first and second constituents means the composition has more of the first and second constituents than any other constituent.

Unless otherwise specified, the use of the ordinal adjectives "first," "second," and "third," etc., to describe a common object, merely indicate that different instances of like objects to which are being referred and are not intended to imply that the objects so described must be in a given sequence, either temporally, spatially, in ranking, or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional," "profile," and "plan" correspond to orthogonal planes within a cartesian coordinate system. Thus, cross-sectional and profile views are taken in the x-z and y-z planes, and plan views are taken in the x-y plane. Typically, profile views in the x-z plane are cross-sectional views. Where appropriate, drawings are labeled with axes to indicate the orientation of the figure.

Materials, structures, and techniques are disclosed to improve the density of random-access memory (RAM) devices. Many RAM devices store data capacitively. RAM density can be improved by using bit cells without discrete capacitors, and by sharing contacts among bit cells and staggering components to compact component layouts. Further scaling can be achieved by decreasing component sizes and storage line pitches. Small transistors can be staggered along shared, narrow channel structures, e.g., within fins, nanowires, nanoribbons, or nanosheets, that can be parallel and offset. Offset channel structures allow for bitlines to be shared by coupled channel structures and to pass between the other channel structures. Layouts can be tightened, e.g., line pitches can be reduced, by stacking some components, including bitlines and transistors, in vertically adjacent layers. Advantageously, system temperatures can be reduced to, e.g., increase conductances, reduce leakage currents, and relieve voltage requirements, thereby enabling smaller component sizes.

FIG. 1 illustrates a plan view of a memory device 101 in an integrated circuit (IC) die 100, including scaled bit cells 110 with staggered read and write transistors 120, 130 and parallel, offset channel structures 121, 131, in accordance with some embodiments. FIG. 1 shows an array of bit cells 110 with adjacent bit cells 110 sharing alternating parallel read bitlines 102 and parallel write bitlines 103. Read bitlines 102 and write bitlines 103 are parallel, both extending in the y direction, and alternate in an every-other fashion in the x direction such that every bit cell 110 is between bitlines 102, 103. Each bit cell 110 includes two transistors, a read transistor 120 and a write transistor 130. Each read transistor 120 shares a read channel structure 121, e.g., a fin or a nanoribbon, with a read transistor 120 in an adjacent bit cell 110. Each write transistor 130 shares a write channel structure 131, e.g., a fin or a nanoribbon, with a write transistor 130 in an adjacent bit cell 110.

Read and write transistors 120, 130 include gate electrodes 124, 134, gate dielectrics (not shown), and channel regions 122, 132 between sources and drains. Channel regions 122, 132 extend the length of gate electrodes 124, 134. As used herein, the term channel indicates a structure that may be activated during operation. The channel may be characterized as a channel structure, semiconductor material structure, or the like. Channel regions may be referred to as those portions of corresponding channel structures carrying charge carriers along a length of the gate electrode.

Read and write transistors 120, 130 can be of any suitable type. Although they may be discussed together, read and write transistors 120, 130 may be of the same type and, e.g., materials, or they may be different types, the same or similar types but including different materials, etc. In some embodiments, read and write transistors 120, 130 are of the same type, but use different materials, e.g., for their respective gate dielectrics. Transistors 120, 130 may be field-effect transistors (FET), e.g., metal-oxide-semiconductor (MOS) FETs, or other transistors. Transistors 120, 130 may be planar transistors. Advantageously, transistors 120, 130 are sufficiently conductive while not occupying overly much lateral area. In some embodiments, transistors 120, 130 are non-planar transistors, such as a FinFET, where channel regions 122, 132 are within a substantially vertical fin, a relatively thin semiconductor structure under gate electrodes 124, 134 and gate dielectrics. In some embodiments, as in the example of FIG. 1, transistors 120, 130 are non-planar transistors, and channel regions 122, 132 are within nanowires or nanosheets with gate electrodes 124, 134 and gate dielectrics vertically around the nanowires or nanosheets, including channel regions 122, 132. In some embodiments, read and write transistors 120, 130 are of the same or similar type, e.g., non-planar MOSFETs, but use different structures. Such non-planar transistors provide increased conductance relative to at least some other types and can be formed with very small dimensions, e.g., channel thicknesses. In some embodiments, read or write transistors 120, 130 are non-planar transistors, and channel regions 122, 132 have a channel thickness of not more than 2 nm.

A gate dielectric is an insulator between gate electrode 124, 134 and channel region 122, 132 such that the gate structure is in contact with channel region 122, 132, but the control signal on gate electrode 124, 134 is not electrically connected through to channel region 122, 132. With the gate dielectric as part of the gate structure, an electric field with strength proportional to the control voltage on gate electrode 124, 134 modulates conduction through channel region 122, 132. Gate dielectrics may have multiple layers. The one or more layers of gate dielectric may include silicon oxide, silicon dioxide ($SiO_2$), and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In some embodiments, the gate dielectric for read transistors 120 includes a different material (e.g., a high-k gate dielectric, such as hafnium oxide) than the gate dielectric for write transistors 130 (e.g., silicon dioxide).

Gate electrode 124, 134 can be of any material suitable for controlling current through channel region 122, 132, e.g., a metal for establishing the gate field. Gate electrode 124, 134 may include one layer or a stack of layers. Gate electrode 124, 134 is on the gate dielectric and may include of at least one of a p-type work function metal or an n-type work function metal, depending on whether the transistor is, e.g., a p-type MOS (PMOS) or an n-type MOS (NMOS) transistor. In some embodiments, gate electrode 124, 134 is a stack of two or more metal layers, where one or more metal layers are work function metal layers and at least one metal layer is a fill metal layer. In some embodiments, gate electrode 124, 134 includes titanium, tantalum, or tungsten. In some such embodiments, gate electrode 124, 134 also includes nitrogen. Other materials may be used.

Read and write transistors 120, 130 control the access to the memory array by electrically connecting (or not) the storage node 115 of bit cell 110 to bitlines 102, 103. The conduction of read and write transistors 120, 130 is controlled by the voltage signal applied to, e.g., gate electrodes 124, 134 by a wordline.

Read and write channel structures 121, 131 are parallel and offset. Channel structures 121, 131 both extend in the x direction with read channel structures 121 collinear and write channel structures 131 collinear. In the top view of the example of FIG. 1, read and write channel structures 121, 131 (and read and write channel regions 122, 132 respectively within them) are at a same lateral level, within a horizontal layer of IC die 100. Read and write channel structures 121, 131 are offset, i.e., staggered in the x direction such that (although they may be the same length) their ends are not aligned in the y direction. This offset or staggering allows, e.g., write bitlines 103 to pass between read channel structures 121 and read bitlines 102 to pass between write channel structures 131. On the other hand, write bitlines 103 intersect and couple to write channel structures 131, electrically connecting write bitlines 103 to write channel regions 132 within write channel structures 131. Likewise, read bitlines 102 intersect and couple to read channel structures 121, electrically connecting read bitlines 102 to read channel regions 122 within read channel structures 121. Advantageously, and as shown, these connections can be made without the necessity of metallization jogs, which simplifies lithography and manufacturing.

Read gate electrodes 124 are coupled and electrically connected to write channel structures 131 in each bit cell 110. This electrical connection forms the storage node 115 of bit cell 110. Storage node 115 has access to (or can be accessed by) both read bitlines 102 and write bitlines 103 by read transistor 120 and write transistor 130, respectively. Read gate electrode 124 is coupled and electrically connected to an inner end of write channel structure 131 (inner being relative, inward into bit cell 110 from the outer end). The inner end may correspond to a source or drain region at either end of read and write transistors 120, 130 and read and write channel regions 122, 132. In some embodiments, read and write transistors 120, 130 are structurally and electrically symmetric, e.g., currents may flow in both directions approximately equally, and the source or drain region and either ends of read and write channel regions 122, 132 are interchangeable. Although a source or drain terminal or contact may be specified in some instances, such usage is not limiting in the context of this description. Either terminal can be used in place of the other in the provided examples.

The connection of read gate electrode 124 to write channel structure 131 can be by any suitable means. In some embodiments, a deposited conductor, e.g., of polycrystalline silicon, couples and electrically connects a metal read gate electrode 124 to an epitaxially deposited and conductive source or drain structure on write channel structure 131. In some such embodiments, write channel structure 131 is a fin, and the source or drain structure is a block (or faceted block) of material that does not match the shape of fin. In some embodiments, a metal read gate electrode 124 overlaps and couples to write channel structure 131 and, without an insulating gate dielectric, electrically connects write channel structure 131 to read gate electrode 124. In some embodiments, write channel structure 131 is doped more heavily than write channel regions 132, and the inner end of write channel structure 131 is more conductive than write channel regions 132.

A magnified portion of FIG. 1 shows three bit cells 110A, 110B, 110C between write bitlines 103 alternating with read bitlines 102, both bitlines 102, 103 extending in the y direction. Read transistors 120 include read channel regions 122 and read gate electrodes 124, and read gate electrodes 124 are coupled to read channel regions 122. Write transistors 130 include write channel regions 132 and write gate electrodes 134, and write gate electrodes 134 are coupled to write channel regions 132. The inner ends of write channel regions 132 (the ends on the side of storage node 115) are coupled and electrically connected to read gate electrodes 124. Both read channel structures 121 (and read channel regions 122 within read channel structures 121) and write channel structures 131 (and write channel regions 132 within write channel structures 131) extend in the x direction. Bit cells 110A, 110B are on opposite sides of read bitline 102. Bit cells 110B, 110C are on opposite sides of write bitline 103. Read channel regions 122 of bit cells 110A, 110B are within read channel structure 121 coupled to read bitline 102. Write channel regions 132 of bit cells 110B, 110C are within write channel structure 131 coupled to write bitline 103.

Channel structures 121, 131 shown on either side of read and write bitlines 102, 103 are contiguous structures coupled and electrically connected to their corresponding bitlines 102, 103, which are shown from the top view over channel structures 121, 131. Read transistors 120 in bit cells 110A, 110B (on opposite sides of read bitline 102) share read channel structure 121, which includes read channel regions 122 of read transistors 120 in bit cells 110A, 110B. Write transistors 130 in bit cells 110B, 110C (on opposite sides of write bitline 103) share write channel structure 131, which includes write channel regions 132 of write transistors 130 in bit cells 110B, 110C. In some embodiments, read channel structure 121 and write channel structure 131 are vertical fins that include within them read channel regions 122 and write channel regions 132, respectively. In some embodiments, read channel structure 121 and write channel structure 131 are nanowires or nanosheets that include within them read channel regions 122 and write channel regions 132, respectively.

As shown in FIG. 1, parallel and alternating read and write bitlines 102, 103 are orthogonal to read and write channel regions 122, 132. An orthogonal grid layout has the benefits of straightforward geometries and consequently of inexpensive and convenient lithography and manufacturing. While an orthogonal layout allows for staggered read and write transistors 120, 130 on offset read and write channel structures 121, 131 and shared contacts on read and write bitlines 102, 103, other orientations are possible. Bit cells 110 can be laterally compacted such that other layouts are beneficial. In some embodiments, read and write bitlines 102, 103 are 30° off the y axis (and forming an angle of 60° with read and write channel structures 121, 131 and read and write channel regions 122, 132), and bit cells 110 are hexagonally packed, arranged in a hexagonal lattice, in staggered rows, like a honeycomb. Other arrangements may be used.

Figure 2:
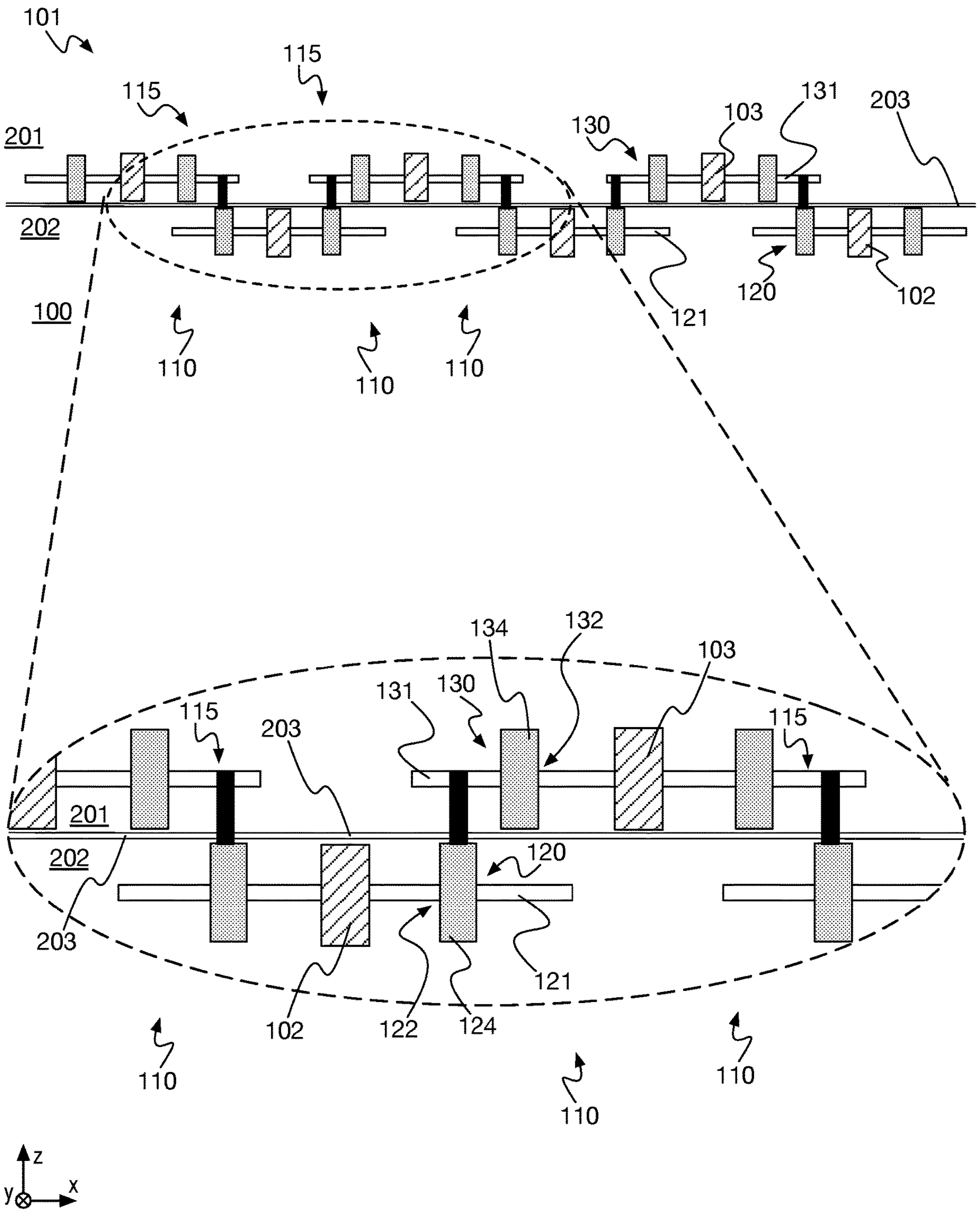
FIG. 2 illustrates a cross-sectional profile view of a memory device in an IC die, including scaled bit cells with staggered read and write transistors and parallel, offset channel structures.

FIG. 2 illustrates a cross-sectional profile view of memory device 101 in IC die 100, including scaled bit cells 110 with staggered read and write transistors 120, 130 and parallel, offset channel structures 121, 131, in accordance with some embodiments. As with the example of FIG. 1, FIG. 2 shows an array of bit cells 110 with alternating parallel read and write bitlines 102, 103, both extending in the y direction. Each read transistor 120 shares a read channel structure 121, e.g., a fin or a nanoribbon, with a read transistor 120 in an adjacent bit cell 110. Each write transistor 130 shares a write channel structure 131, e.g., a fin or a nanoribbon, with a write transistor 130 in an adjacent bit cell 110. In FIG. 2, although each bit cell 110 includes read and write transistors 120, 130, read and write channel structures 121, 131 and read and write channel regions 122, 132 are parallel in vertically adjacent layers of IC die 100. Etch-stop layer 203 separates a front side 201 of IC die 100 from a back side 202 of IC die 100. Read channel structures 121 and read channel regions 122 are on back side 202. Write channel structures 131 and write channel regions 132 are on front side 201. In some embodiments, write channel structures 131 and write channel regions 132 are on back side 202, and read channel structures 121 and read channel regions 122 are on front side 201. Forming read or write transistors 120, 130 and read or write channel structures 121, 131 on back side 202 allows for doubling of the line and component pitches while maintaining the total memory storage. Advantageously, by maintaining line and component pitches and utilizing vertical area in IC die 100, memory density can be increased.

With read and write transistors 120, 130 in vertically adjacent layers of IC die 100, e.g., front side 201 and back side 202, the coupling and electrically connection of read gate electrode 124 and write channel structure 131 may be by, e.g., metallization via connection through etch-stop layer 203, or any suitable means. For example, damascene or dual-damascene structures may be formed to connect the structures, or the structures may be formed over pre-formed metallization structures.

Read and write transistors 120, 130 in vertically adjacent layers may be of any suitable type. Transistors 120, 130 may be formed from a semiconductor substrate, e.g., by conventional etch and growth means. In some embodiments, read and write transistors 120, 130 are of the same or similar type, e.g., non-planar MOSFETs, but use different structures. In some such embodiments, read transistors 120 are FinFETs with vertical fin structures as read channel structures 121, and write transistors 130 have write channel regions 132 within nanowire or nanosheet write channel structures 131. Read and write transistors 120, 130 in vertically adjacent layers may be of the same type or, e.g., read transistors 120 on front side 201 may be formed, e.g., etched or grown, from a semiconductor substrate, and write transistors 130 on back side 202 may be formed by thin-film deposition. That is, read or write transistors 120, 130 may be thin-film transistors (TFTs). In some embodiments, read or write transistors 120, 130 are TFTs and include amorphous or polycrystalline materials that include a metal and oxygen, such as a metal oxide. In some embodiments, read or write transistors 120, 130 include a thin, metal-oxide film that may be semiconducting substantially as-deposited, and/or following some subsequent activation process, such as a thermal anneal. Oxide semiconductor materials primarily include one or more metals and oxygen. The metal(s) may be from the transition metals or post-transition metals. The metal oxide compounds may be suboxides ($A_2O$), monoxides (AO), binary oxides ($AO_2$), ternary oxides ($ABO_3$), and mixtures thereof, for example. In some embodiments, such a thin film includes oxygen and at least one of Mg, Cu, Zn, Sn, Ti, In, Ga, or Al. In some specific embodiments, transistors 120, 130 include a zinc oxide ($ZnO_x$), such as Zn(II) oxide, or ZnO, zinc peroxide ($ZnO_2$)m or a mixture of ZnO and $ZnO_2$ In some specific embodiments, transistors 120, 130 include $ZnO_x$ and indium oxide $InO_x$ (e.g., $In_2O_3$). In some further embodiments, transistors 120, 130 include IGZO, a composition of indium, gallium, zinc, and oxygen, e.g., zinc oxide, indium oxide, and gallium oxide (e.g., $Ga_2O_3$). The metal atomic composition ratio, for example Ga to each of In and Z (Ga:In:Z), may vary. In some examples, transistors 120, 130 include a Ga-rich IGZO. Transistors 120, 130 may include one or more dopants such as another metal or a nonmetallic dopant, such as N, O, H, F, Cl, Si, or Ge, that may introduce electron vacancies or oxygen vacancies.

The thin film may have any morphology or microstructure. In some embodiments, the thin film is substantially amorphous (i.e., having no discernable long-rang order). However, depending on the substrate and the deposition process, the thin film may be polycrystalline (e.g., microcrystalline or nanocrystalline) metal oxide material. The thin film may be deposited to a thickness of less than 1 nm and up to 20 nm, for example. The oxide semiconductor thickness can be chosen to optimized selected transistor channel characteristics, for example, high carrier mobility and a material band gap and resistivity that is tunable by a dopant that impacts the charge carrier (e.g., electron) concentrations.

FIGS. 3A, 3B, 3C, and 3D illustrate plan views of memory device 101 in IC die 100 and schematic views of bit cells 110, in accordance with some embodiments. The array of bit cells 110 can employ read and write transistors 120, 130 with either conductivity type, e.g., p- or n-type, and in any combination. The schematic views of FIGS. 3A-3D show some available circuit designs for bit cells 110, as well as the various conductivity-type combinations of read and write transistors 120, 130 and associated control and output signals.

Figure 3A:
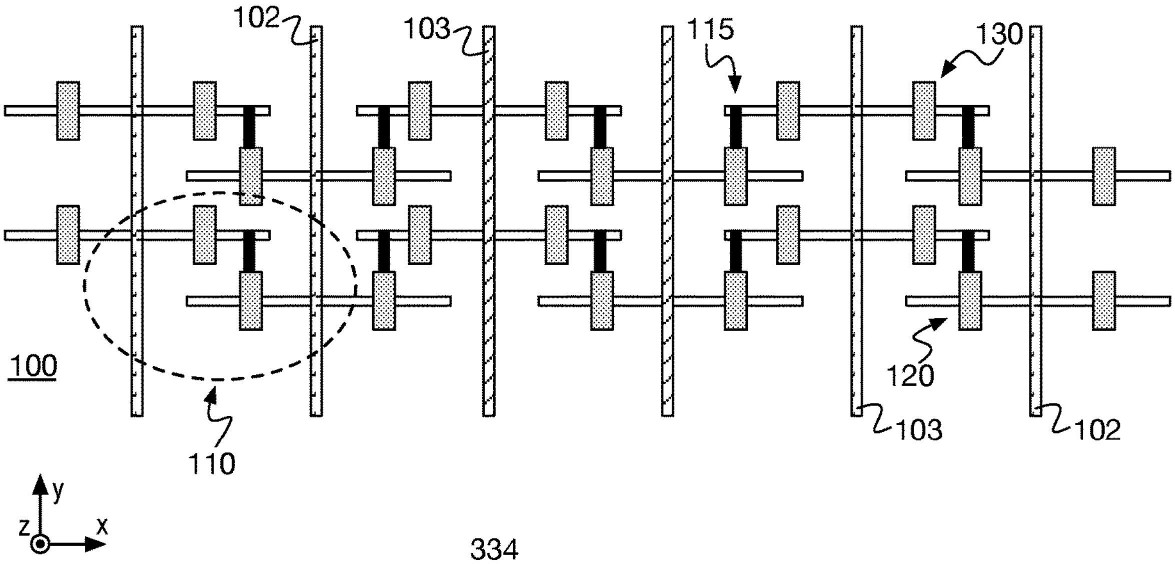
FIGS. 3A, 3B, 3C, and 3D illustrate plan views of a memory device in an IC die and schematic views of bit cells.
Figure 3A:
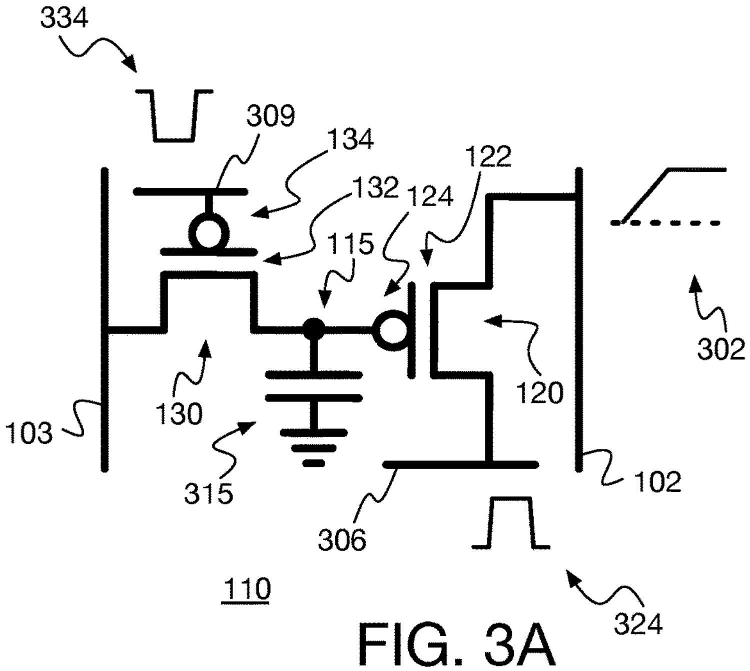

FIG. 3A shows a schematic view of bit cell 110 with p-type read and write transistors 120, 130 (indicated by the inversion "bubbles" on the corresponding gate terminals). A first end (the lower end) of the read channel region 122 is electrically connected to a read wordline 306. A second end of the read channel region 122 is electrically connected to read bitline 102. The inner end of the write channel region 132 is electrically connected to read gate electrode 124, and this electrical connection is storage node 115. The outer end of the write channel region 132 is electrically connected to the write bitline 103. The write transistor 130 includes write gate electrode 134, which is coupled to write channel region 132 and electrically connected to a write wordline 309. Storage node capacitance 315 represents the, e.g., parasitic, capacitance at storage node 115, which does not necessarily represent a discrete capacitor. In some embodiments, there is no discrete capacitor from storage node 115 to ground, and storage node capacitance 315 is the capacitance present between the electrical conductors of the circuit because of their proximity to each other and relative voltage difference. Advantageously for forming a bit cell 110 occupying less lateral area, storage node capacitance 315 is small, and only a small or no discrete capacitor is needed.

Various example control and output signals are shown at their corresponding terminals. The waveform for a write wordline control signal 334 shows that a downward, negative-going pulse on write wordline 309 (and write gate electrode 134) may cause p-type write transistor 130 to conduct, which will pass any information (e.g., in the form of charge) on write bitline 103 (and the outer end of the write channel region 132) to storage node 115. The waveform for a read wordline control signal 324 shows that an upward, positive-going pulse on read wordline 306 (and the first, lower end of the read channel region 122) may cause p-type read transistor 120 to conduct, which will pass any information (e.g., in the form of charge) on storage node 115 (and read gate electrode 124) to read bitline 102. As shown by read bitline output signal 302, if there was a higher voltage or charge representing a logic level 1 present at storage node 115 and read transistor 120 conducts, a logic level 1 (shown by the dotted line) is read out, indicated by a lower voltage or charge on read bitline 102. If there was a lower voltage or charge representing a logic level 0 present at storage node 115, the upward, positive-going pulse will not cause read transistor 120 to conduct, and a logic level 0 (represented by the solid line) is read out, indicated by a higher voltage or charge on read bitline 102.

Figure 3B:
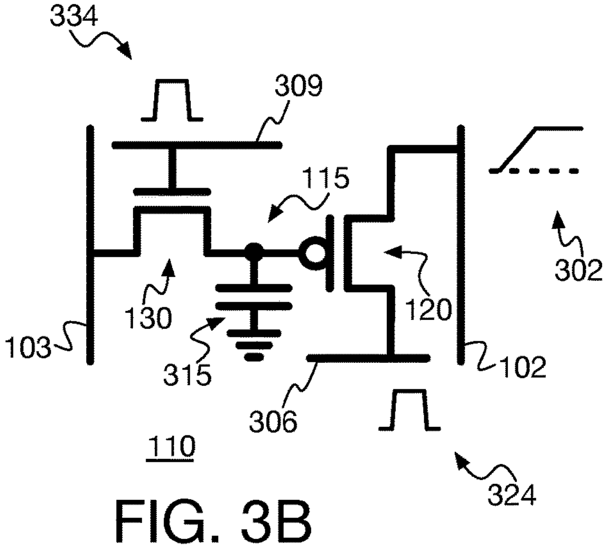

FIG. 3B shows a schematic view of bit cell 110 with n-type write transistor 130 and p-type read transistor 120. The operation is similar, but an upward, positive-going pulse on write wordline 309 (and write gate electrode 134) is used to pass a bit through n-type write transistor 130.

Figure 3C:
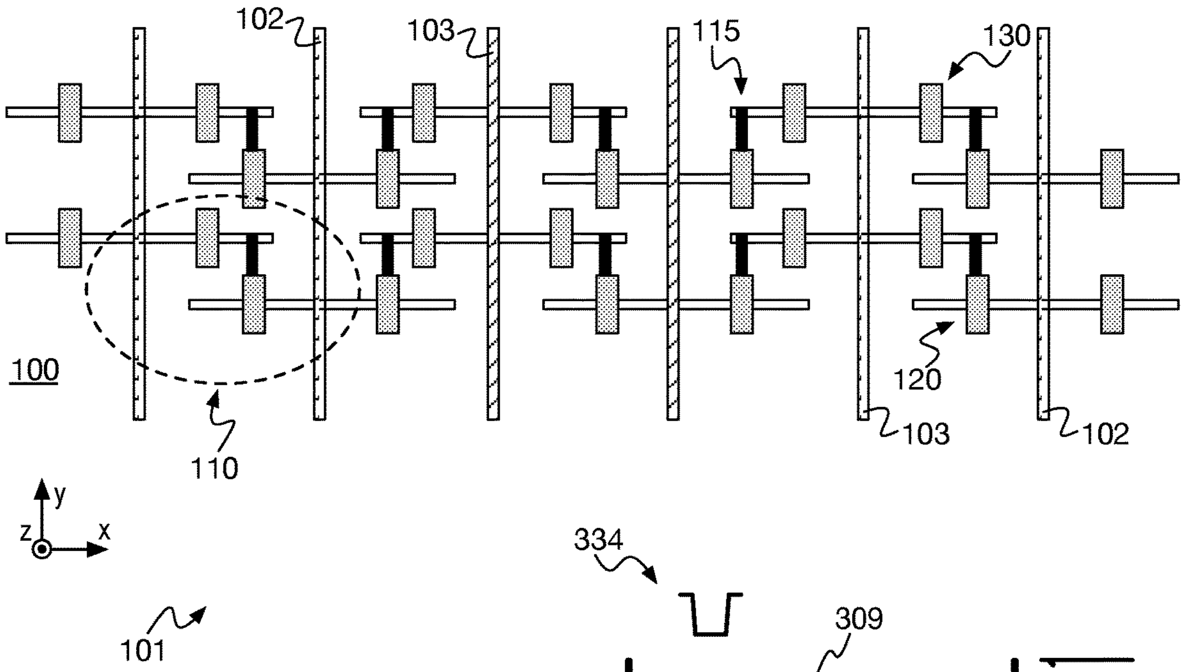
Figure 3C:
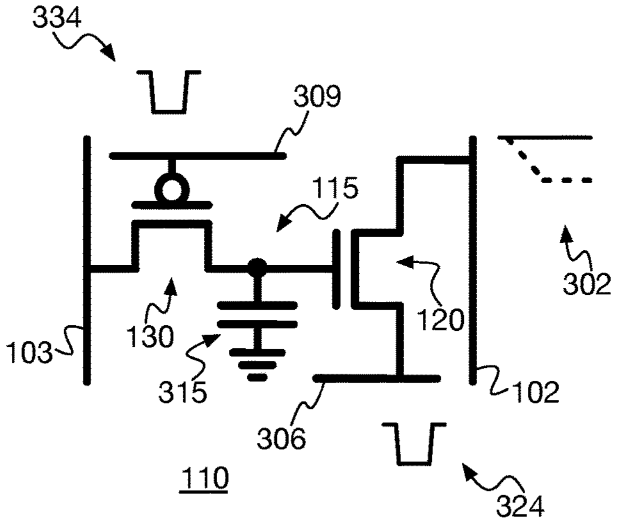

FIG. 3C shows a schematic view of bit cell 110 with p-type write transistor 130 and n-type read transistor 120. The operation is similar to the example of FIG. 3A, but a downward, negative-going pulse on read wordline 306 (and the first, lower end of the read channel region 122) is used to pass a bit through n-type read transistor 120.

Figure 3D:
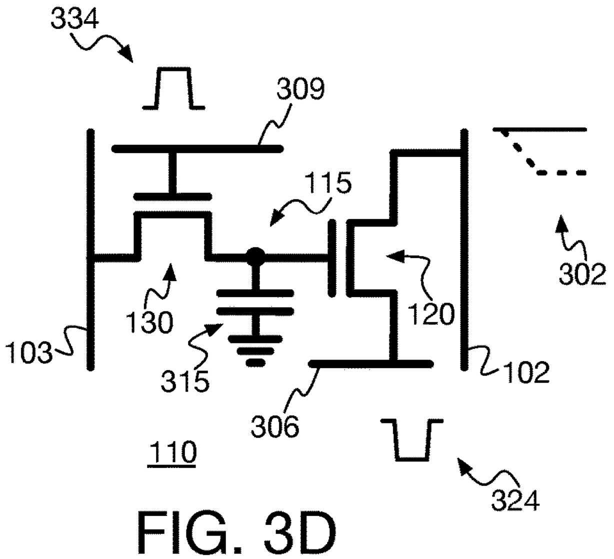

FIG. 3D shows a schematic view of bit cell 110 with n-type write transistor 130 and n-type read transistor 120. The operation is opposite to the example of FIG. 3A, with an upward, positive-going pulse on write wordline 309 (and write gate electrode 134) used to pass a bit through n-type write transistor 130 and a downward, negative-going pulse on read wordline 306 (and the first, lower end of the read channel region 122) used to pass a bit through n-type read transistor 120.

Bit cells 110 may employ read and write transistors 120, 130 with either conductivity type, e.g., p- or n-type, and in any combination. Various combinations may be used to optimize for certain characteristics, e.g., minimizing lateral area used, maximizing switching speed, minimizing leakage current, etc. In some embodiments, smaller cell sizes are prioritized, and read and write transistors 120, 130 are of a same conductivity type, both p-type or both n-type. In some embodiments, read transistors 120 are p-type, and write transistors 130 are n-type. In some embodiments, read transistors 120 are n-type, and write transistors 130 are p-type.

Figure 4A:
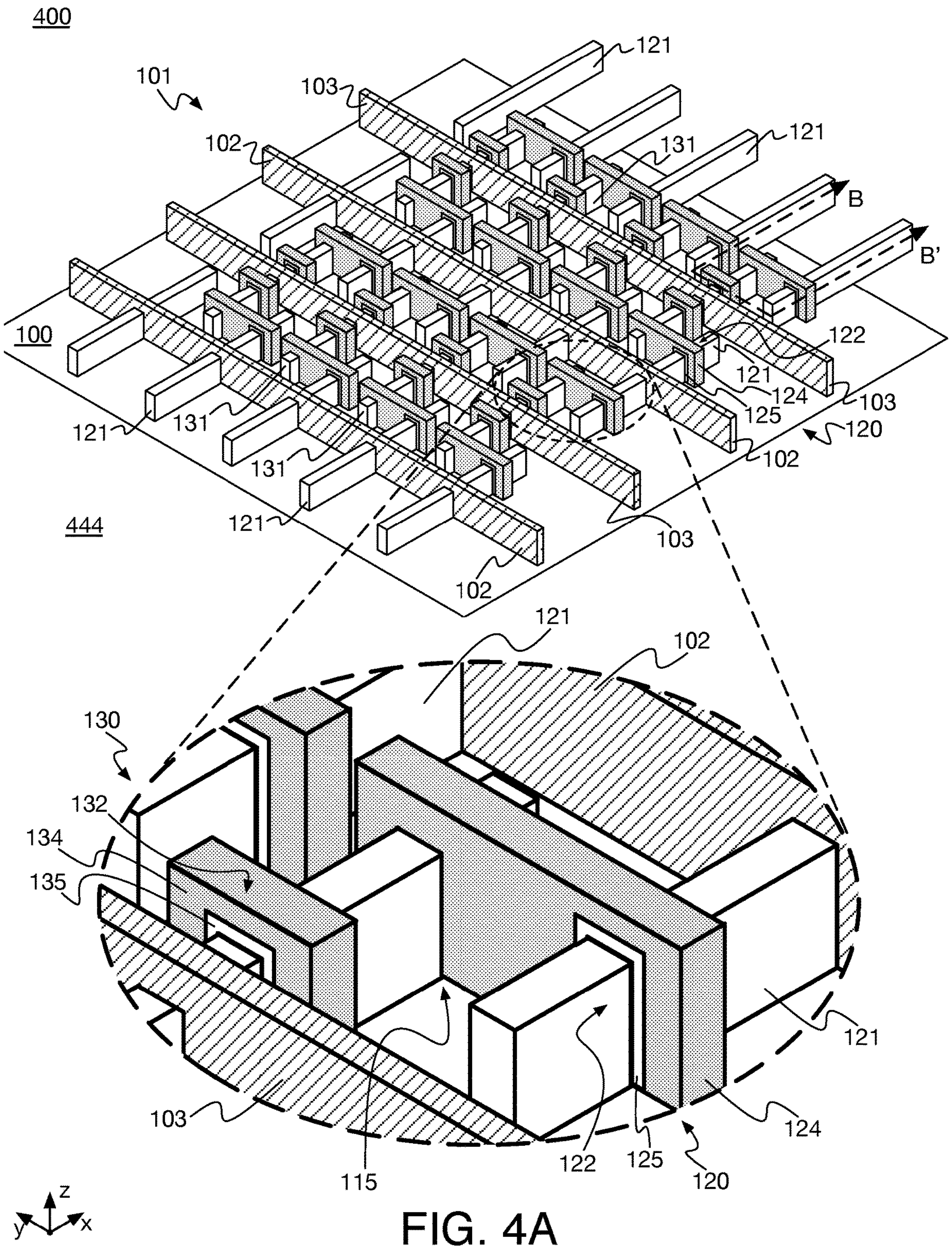
FIGS. 4A, 4B, 4C, 4D, 4E, and 4F illustrate isometric and cross-sectional profile views of a memory device in an IC die and IC system, including scaled bit cells with staggered read and write transistors and parallel, offset channel structures.
Figure 4B:
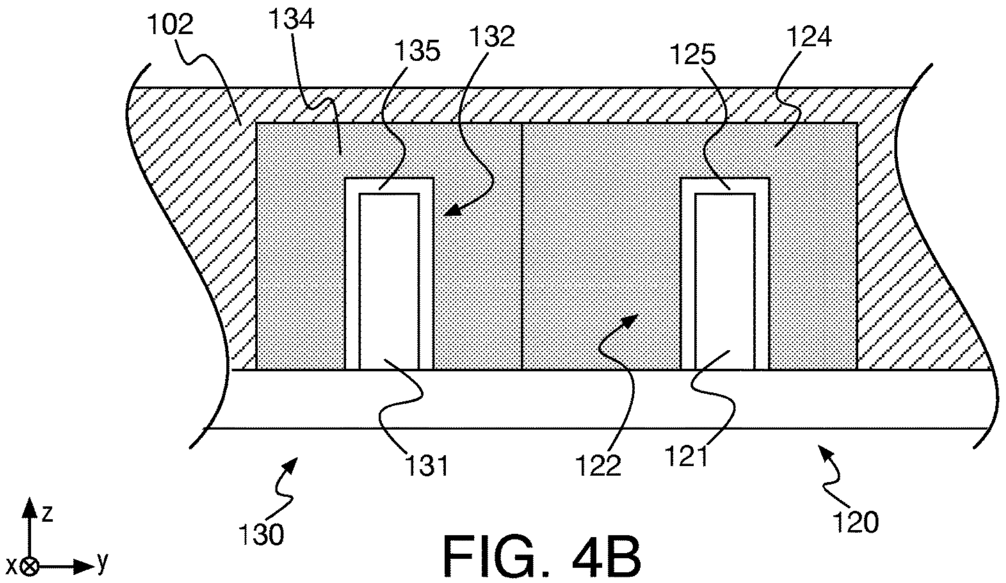

FIGS. 4A, 4B, 4C, 4D, 4E, and 4F illustrate isometric and cross-sectional profile views of memory device 101 in IC die 100 and IC system 400, including scaled bit cells 110 with staggered read and write transistors 120, 130 and parallel, offset channel structures 121, 131, in accordance with some embodiments. FIG. 4A shows an array of bit cells 110 with read and write channel structures 121, 131 (and read and write channel regions 122, 132) within a same horizontal layer on a front side of IC die 100. FIG. 4A shows where a cross-sectional side view is taken at B-B' as shown in FIG. 4B.

Both read and write channel structures 121, 131 are vertical fins. Read and write channel structures 121, 131 are parallel and offset. Channel structures 121, 131 extend in the x direction with read channel structures 121 collinear and write channel structures 131 collinear. Bitlines 102, 103 extend in the y direction. The layout allows for high-density memory while using an orthogonal grid and providing ease of design, lithography, and manufacturing. For example, metallization for, e.g., bitlines 102, 103 can be deposited in simple, straight lines.

A magnified portion in the foreground of FIG. 4A shows an isometric view of a section similar to that shown in the cross-sectional side view of FIG. 4B. The isometric view shows the face of read and write gate electrodes 124, 134, including where they are over read and write channel structures 121, 131 with insulating gate dielectrics (read gate dielectric 125 and write gate dielectric 135) between gate electrodes 124, 134 and channel structures 121, 131. Read gate electrode 124 and write channel structure 131 are coupled and electrically connected at storage node 115. Without an insulating gate dielectric (like read gate dielectric 125 over read channel structure 121 or write gate dielectric 135 over write channel structure 131), read gate electrode 124 overlaps and couples to write channel structure 131, electrically connecting write channel structure 131 to read gate electrode 124.

IC die 100 is coupled to a substrate 444. IC die 100 and its included memory device 101 are coupled to, and energized by, a power supply through substrate 444. Substrate 444 may be any host component with interconnect interfaces to IC die 100, such as a package substrate or interposer, another IC die, etc. Substrate 444 may bond to another host component, such as a package substrate or interposer, another IC die, etc.

FIG. 4B provides a cross-sectional side view at B-B' as shown in FIG. 4A. FIG. 4B shows two similar gate structures. Read gate dielectric 125 over read channel structure 121 insulates read gate electrode 124 from read channel structure 121 and allows the voltage on read gate electrode 124 to control the conduction through read channel region 122 and read transistor 120. Write gate dielectric 135 over write channel structure 131 insulates write gate electrode 134 from write channel structure 131 and allows the voltage on write gate electrode 134 to control the conduction through write channel region 132 and write transistor 130. Read channel structure 121 is between write channel structure 131 and read bitline 102, which is behind read channel structure 121.

Although they look similar in the example of FIG. 4B, read transistor 120 and write transistor 130 need not be of the same or similar types. In some embodiments, they are of similar types (e.g., non-planar, NMOS FETs), but have some different structures or materials. In some embodiments, read and write transistors 120, 130 are of similar types, including structures, but use different materials. For example, in some such embodiments, read and write transistors 120, 130 are FinFETs, read transistors 120 have read gate dielectric 125 including silicon dioxide, and write transistors 130 have write gate dielectric 135 including a high-k gate dielectric material, such as hafnium oxide.

Figure 4C:
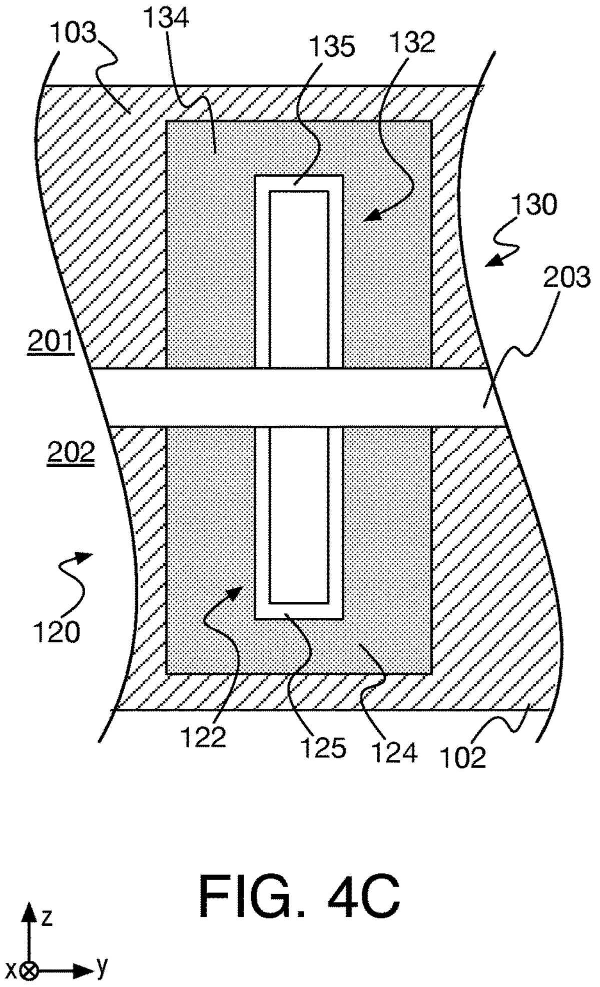

FIG. 4C provides a similar cross-sectional side view as FIG. 4B, but for an array with read and write transistors 120, 130, read and write channel structures 121, 131 and read and write channel regions 122, 132 in vertically adjacent layers of IC die 100. Etch-stop layer 203 separates a front side 201 of IC die 100 from a back side 202 of IC die 100. Read channel structures 121 and read channel regions 122 are on back side 202. Write channel structures 131 and write channel regions 132 are on front side 201. With no read channel structures 121 or read bitline 102 on front side 201, write bitline 103 is seen behind write gate electrode 134. Read gate dielectric 125 over read channel structure 121 insulates read gate electrode 124 from read channel structure 121. Write gate dielectric 135 over write channel structure 131 insulates write gate electrode 134 from write channel structure 131.

Although they look similar in the example of FIG. 4C, read transistor 120 and write transistor 130 need not be of the same or similar types, particularly as they may be formed separately, e.g., with different processes. In some embodiments, they are of similar types (e.g., non-planar, NMOS FETs), but have some different structures. In some such embodiments, read transistors 120 are FinFETs with vertical fin structures as read channel structures 121, and write transistors 130 have write channel regions 132 within nanowire or nanosheet write channel structures 131. In some embodiments, write transistors 130 are FinFETs, and read transistors 120 are TFTs.

Figure 4D:
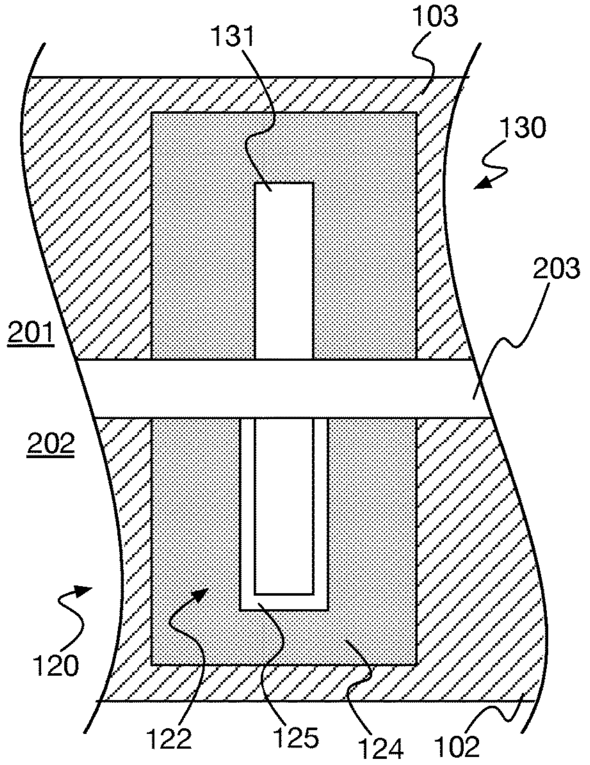

FIG. 4D provides a similar cross-sectional side view as FIG. 4C, but with the viewing plane forward along write channel structure 131, closer to write bitline 103. Write transistor 130 and write gate electrode 134 are now behind the viewing plane. The metallization structure coupling and electrically connecting read gate electrode 124 and write channel structure 131 can be seen extending vertically up through etch-stop layer 203. Without an insulating write gate dielectric 135 over write channel structure 131, read gate electrode 124 (including the portion above etch-stop layer 203) couples to write channel structure 131, electrically connecting write channel structure 131 to read gate electrode 124.

Figure 4E:
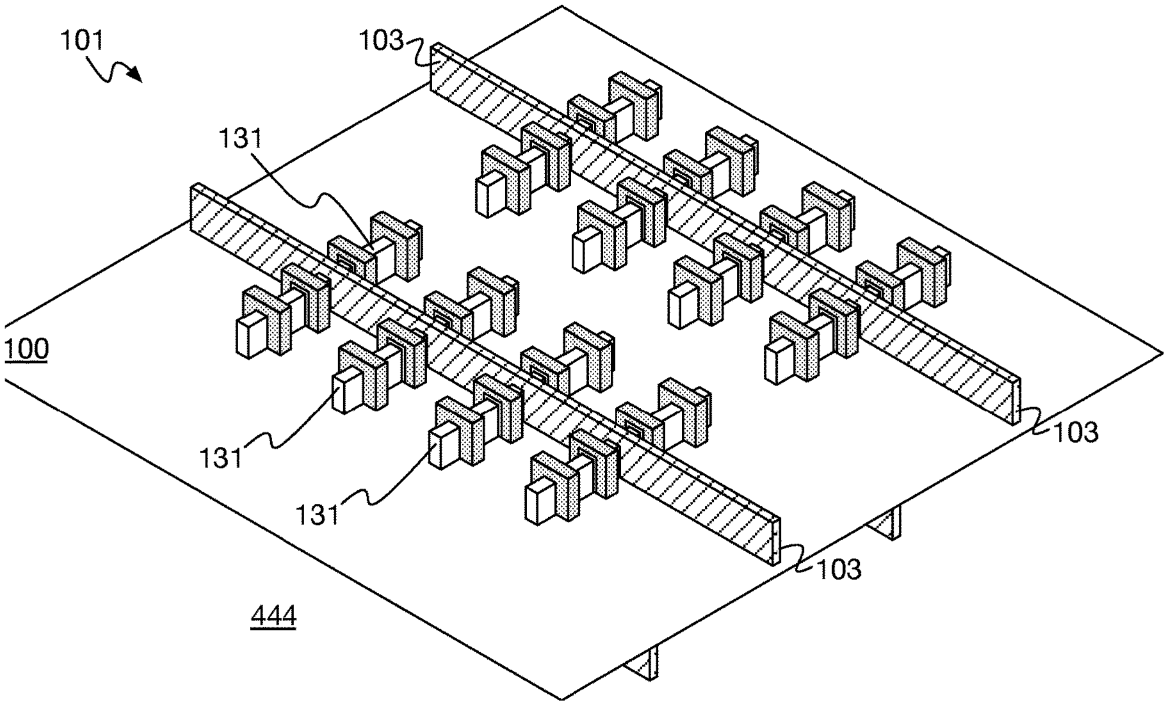

FIG. 4E provides a similar isometric view as FIG. 4A (with larger line and component pitches and the same total memory storage), but of a top or front side 201 of an array with array with read and write transistors 120, 130, read and write channel structures 121, 131 and read and write channel regions 122, 132 in vertically adjacent layers of IC die 100. Etch-stop layer 203 separates a front side 201 of IC die 100 from a back side 202 of IC die 100. Read channel structures 121 and read channel regions 122 (both not shown) are on back side 202. Write channel structures 131, etc., are on front side 201. In some embodiments, read channel structures 121 and read channel regions 122 are on front side 201, and write channel structures 131, etc., are on back side 202.

Figure 4F:
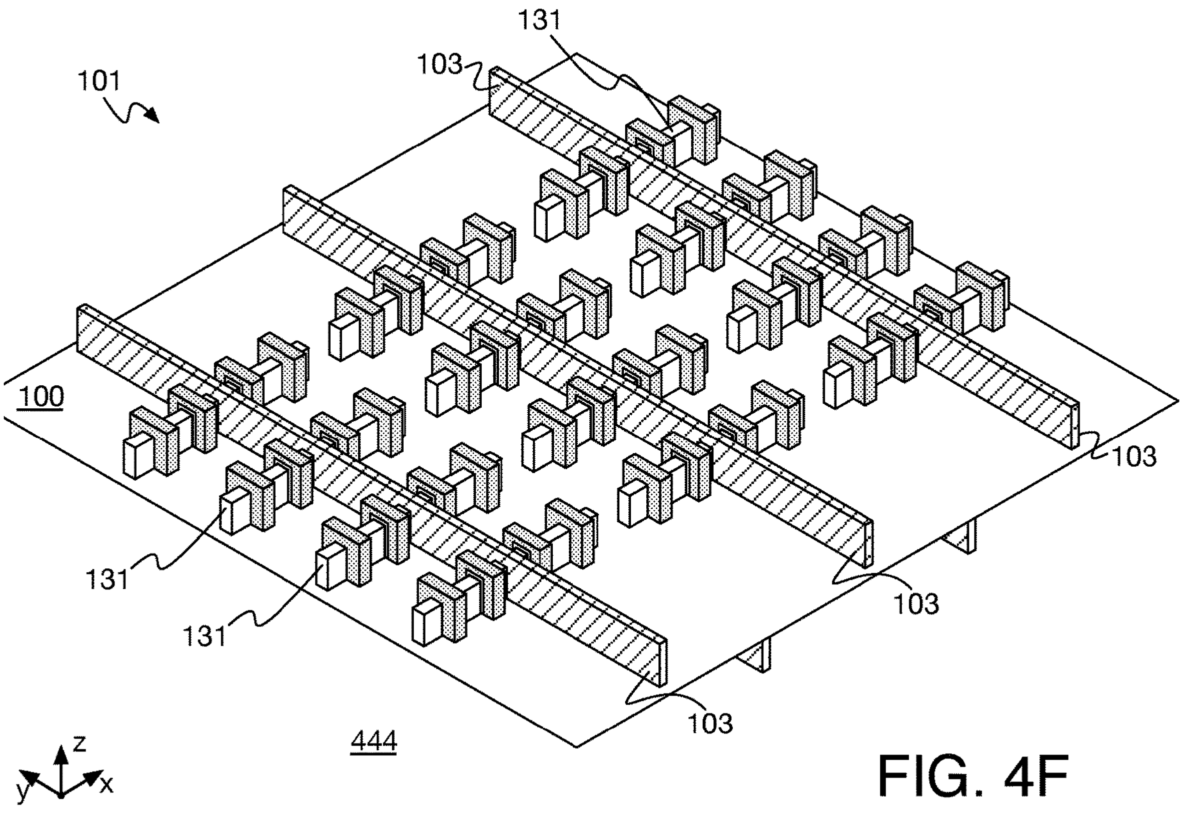

FIG. 4F provides a similar isometric view as FIG. 4E, but with smaller line and component pitches (in the x direction at least) and more total memory storage, i.e., higher memory density. Memory density could be increased further by reducing, e.g., component pitches in the y direction as well.

Figure 5:
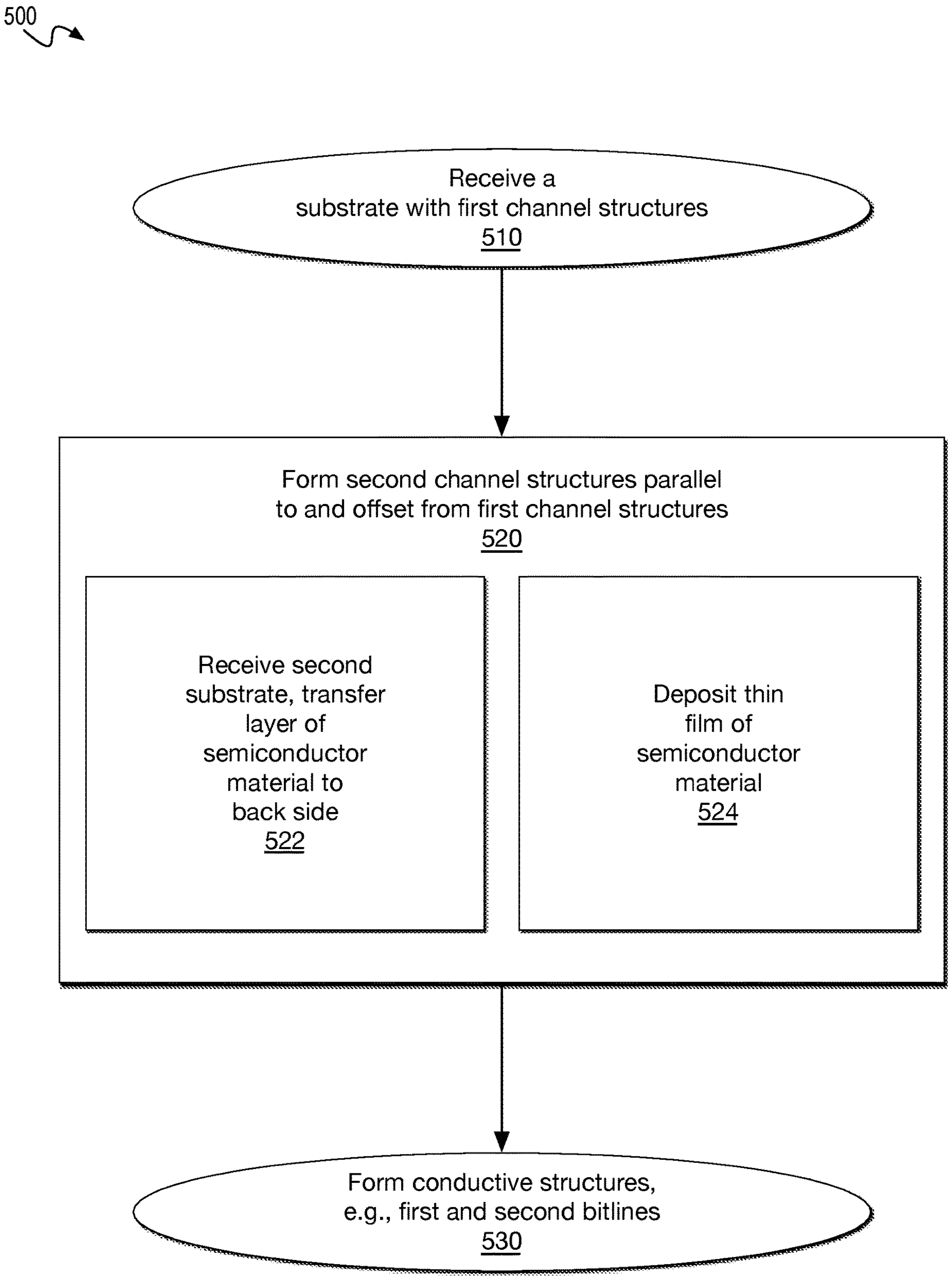
FIG. 5 illustrates various processes or methods for forming bit cells with staggered read and write transistors and offset read and write channel structures.

FIG. 5 illustrates various processes or methods for forming bit cells with staggered read and write transistors and offset read and write channel structures, in accordance with some embodiments. FIG. 5 shows methods 500 that includes operations 510-530. Some operations shown in FIG. 5 are optional. FIG. 5 shows an example sequence, but the operations can be done in other sequences as well, and some operations may be omitted. Some operations can also be performed multiple times before other operations are performed. Some operations may be included within other operations. Some operations may overlap with other operations. Methods 500 generally entail forming groups of storage elements sharing an access transistor and at the intersections of source lines and one or more storage lines.

In operation 510, a substrate with a transistor is received for forming an array of channel structures. The substrate may have one set of, e.g., read or write, channel structures already formed as received for forming transistors. Such channel structures may be collinear and extending in a direction, e.g., laterally along a surface of the substrate, e.g., in the x or y direction. The channel structures may be, e.g., vertical fins or nanosheets or nanowires. The channel structures may be substantially planar. There may be a group of channel structures arranged collinearly and other channel structures parallel to the first group.

The substrate may include any suitable material or materials. Any suitable semiconductor or other material can be used. A transistor may be of the same material as the substrate or, e.g., deposited on the substrate. The substrate may include a semiconductor material that transistors can be formed out of and on, including a crystalline material. In some examples, the substrate may include monocrystalline silicon (Si), germanium (Ge), silicon germanium (SiGe), a III-V alloy material (e.g., gallium arsenide (GaAs)), a silicon carbide (SiC), a sapphire ($Al_2O_3$), or any combination thereof. In some embodiments, the substrate includes crystalline silicon and subsequent components are also silicon.

In operation 520, a second group of channel structures is formed. The channel structures are formed collinearly within the set and parallel to the first group. Though parallel, the second group of channel structures is formed offset from the first group. By forming two parallel series of channel structures, each series collinear, offset gaps can be formed between the channel structures to later be used for, e.g., metallization structures or other interconnections.

The two parallel groups of channel structures can be in a same horizontal layer of the received substrate. For example, the substrate can be received with a group of collinear channel structures on a front side, and a second group of collinear channel structures can be formed, parallel but offset, on the same surface of the front side. In some embodiments, the substrate is received with a group of collinear channel structures on a front side, and a second group of collinear channel structures is formed in a vertically adjacent layer, e.g., over the first group. In some embodiments, the substrate is received with a group of collinear channel structures on a front side, and a second group of collinear channel structures is formed in a vertically adjacent layer on a back side after mounting the front side to, e.g., a carrier wafer and inverting the substrate.

The forming of the second group of collinear channel structures in operation 520 may include one or both of operations 522 and 524. In operation 522, the second group of collinear channel structures will be formed on a back side of the received substrate. The front side processing can be completed first, e.g., the first group of channel structures and transistors can be formed and metallization structures, e.g., a set of bit lines, may be formed over the first group. For example, if read channel structures are formed on the front side, read bit lines may be formed over the read channel structures, and write channel structures and write bit lines may be formed on the back side, the write channel structures parallel but offset from the read channel structures, and the write bit lines parallel to the read bit lines.

After front-side processing is complete, the front side of the received substrate can be mounted to, e.g., a carrier wafer, and the received substrate can be inverted such that the back side of the received substrate is revealed. The back side of the received substrate can be ground down to just below the structures processed on the front side. For example, in the case of a silicon wafer with vertical fin channel structures, the back-side silicon can be precisely removed by grinding until the inter-layer dielectric (ILD) between fins is just exposed and detected. The back side can then be polished and an etch-stop layer (ESL) can be deposited or otherwise formed over the entire back-side surface of the substrate. In operation 522, a second substrate is received and a layer of semiconductor material is removed from the second substrate and transferred to the back side of the substrate. The newly transferred semiconductor material can be processed much as the semiconductor material on the front side was. In some embodiments, collinear fins are formed on the back side, parallel to but offset from the first group on the front side. Whether before or after back-side channel structures are formed, interconnections, e.g., metallization structures, can be formed between the vertically adjacent layers. For example, the gate structure of the read channel structures can be coupled and electrically connected to the write channel structures to form the storage node.

In operation 524, a second group of channel structures is formed by depositing a thin film of semiconductor material over the first received substrate. The second group of channel structures is formed in a layer vertically adjacent to the layer having the first group of channel structures, whether that layer is on the front side or back side.

In some embodiments, an electrode material is first deposited using any suitable technique, e.g., physical vapor deposition PVD. In some such embodiments, the electrode material includes at least one metal, such as Ti, W, Ta, or Al. In further embodiments, the gate electrode material comprises nitrogen (e.g., $TiN_x$, $WN_x$, $TaN_x$, or $AlN_x$). Other materials may also be included. In some embodiments, the channel material may be deposited and include a metal oxide, as previously discussed, such as IGZO.

A metal oxide $MO_x$ may then be deposited on a surface of the electrode or on a surface of the channel material. The metal oxide is to be functional as a gate dielectric and may be any of materials already described or others. In some exemplary embodiments, a high-k metal oxide is deposited. The metal(s) M, which may include one or more Hf, Zr, Al, or Ga, for example, may be deposited with an atomic layer deposition (ALD) process that further comprises an oxidation phase.

An interlayer may then be deposited upon the first layer of metal oxide. The interlayer may be deposited by any technique suitable for the composition desired. In some embodiments, an interlayer comprising substantially silicon is deposited by PVD. In other embodiments, an interlayer comprising a second metal (M2) is deposited either by PVD or ALD. In one example where the second metal is Mg, an interlayer of $MgO_x$ is deposited by ALD. In another example where the second metal is La, an interlayer of $LaO_x$ may be deposited, either by ALD or by PVD.

Following deposition of the interlayer, another layer of metal oxide $MO_x$ is deposited on a surface of the interlayer. The additional layer of $MO_x$ advantageously includes the same metal(s) as the first layer of $MO_x$. In some embodiments, the layers of $MO_x$ deposited have substantially the same composition, and are deposited by the same technique. For example, the metal(s) M may again include one or more Hf, Zr, Al, or Ga. Hence, a thickness of the interlayer is inserted between two thicknesses of the $MO_x$ gate dielectric.

A channel material may be deposited over the gate dielectric for some embodiments. In other embodiments, an electrode material is deposited over the gate dielectric. Accordingly, any electrode materials or channel materials described elsewhere herein may be deposited. In some embodiments, a channel material comprising a metal oxide, such as IGZO, is deposited. In other embodiments, an electrode material comprising at least one metal, such as Ti, W, Ta, or Al, or a nitride thereof, is deposited.

In operation 530, conductive structures are formed, including at least the read and write bitlines. Other structures, such as via connections, or other electrodes or contacts, may also be formed.

The bitlines should extend in a direction orthogonal to the direction of the first and second groups of channel structures. The bitlines may be formed over corresponding channel structures and through the offset gaps of the other channel structures. For example, read bitlines should be formed over the read channel structures, coupling and electrically connecting the read bitlines to the read channel structures, but between the gaps of the write channel structures. The read and write bitlines should be formed parallel, extending in the same direction and through the alternating gaps between the non-corresponding channel structures. The write bitlines should be formed over the write channel structures, coupling and electrically connecting the write bitlines to the write channel structures, but between the gaps of the read channel structures.

The bitlines and other metallization structures can be formed by any suitable means, and as has already been discussed, e.g., by ALD, PVD, damascene, dual-damascene, etc.

Figure 6:
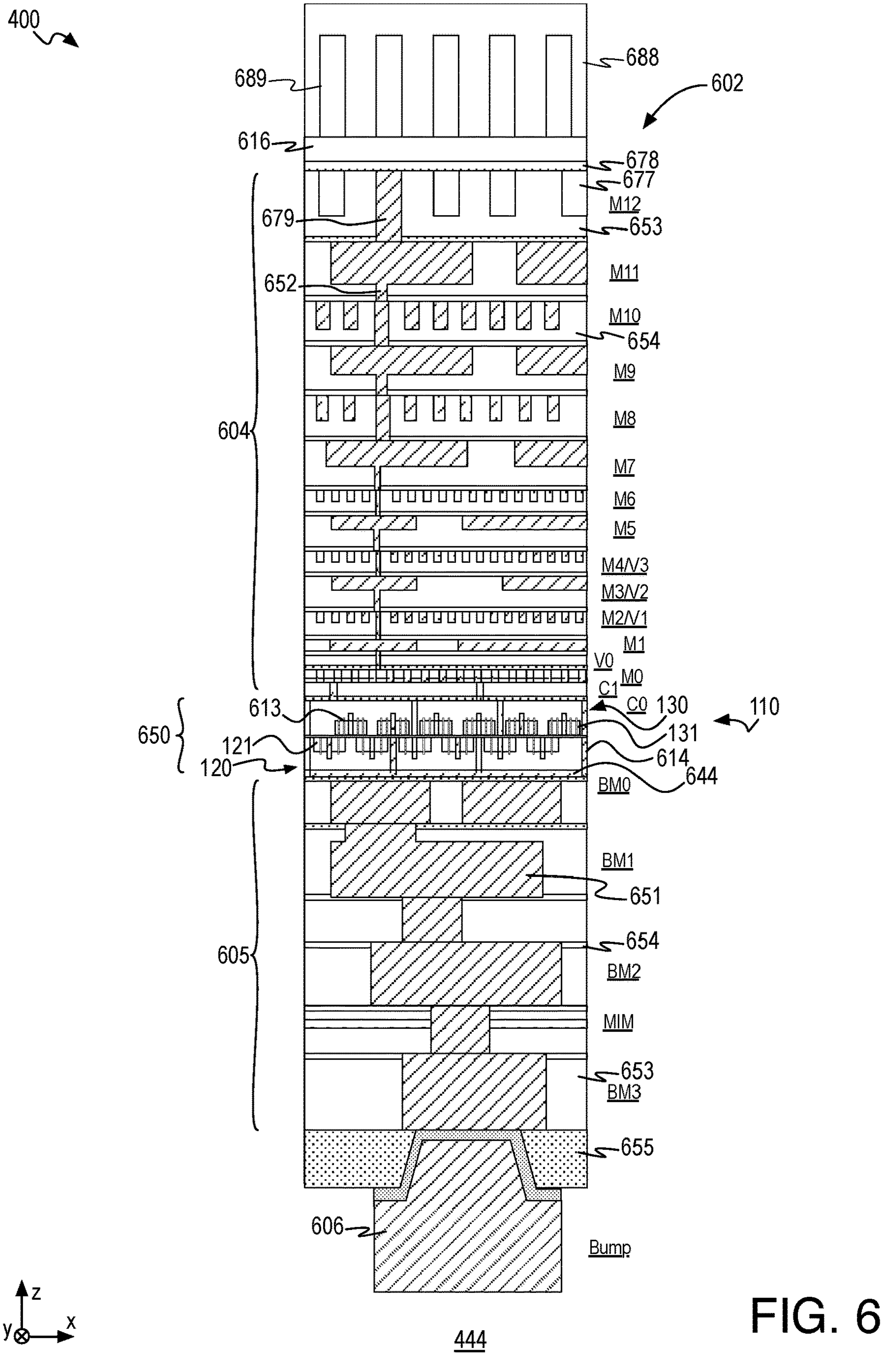
FIG. 6 illustrates a cross-sectional view of a low-temperature IC system having scaled bit cells with staggered read and write transistors and parallel, offset read and write channel structures and using die- and package-level active cooling.

Scaled bit cells 110 with staggered read and write transistors 120, 130 and parallel, offset read and write channel structures 121, 131 may advantageously be integrated into a low-temperature IC system 400, such as that shown in FIG. 6, for improved operation. For example, some suitable materials, such as semiconductor materials, have increased carrier mobility, reduced leakage currents, and reduced contact resistance (e.g., at the interfaces between semiconductor and metal) at low temperatures. Some storage materials have reduced disturb issues and voltage requirements at the lower energy levels corresponding to lower temperatures. Such enhanced performance, e.g., conduction, can enable the use of, e.g., different materials and structures, such as smaller read and write channel structures 121, 131. In some embodiments, read and write channel structures 121, 131 as described (e.g., in fins, nanosheets, nanoribbons, or nanowires) have a thickness of 2 nm. Yet lower temperatures can further enhance conditions and allow for yet smaller dimensions and associated pitches, and enable increased memory density. In some embodiments, read and write channel structures 121, 131, as described have a thickness of 1 nm.

A number of structures may be used to lower the system temperature and so allow for the use of, e.g., smaller conducting structures. Active cooling structures can be used to lower system temperatures to below ambient temperature, even to well below ambient temperature. Active cooling structures can include thermoelectric coolers. In some embodiments, active cooling structures include stacks of alternating p- and n-type semiconductor materials. In some embodiments, active cooling structures flow cooling fluids through channels, including microchannels, thermally coupled to IC packages. In some embodiments, active cooling structures include channels thermally coupled to IC dies 100. In some embodiments, active cooling structures include channels on one or more sides of IC dies 100. In some embodiments, active cooling structures include channels within IC dies 100. In some embodiments, active cooling structures include two-phase cooling. In some embodiments, active cooling structures include low-boiling-point fluids. In some embodiments, active cooling structures include refrigerants as cooling fluids. In some embodiments, active cooling structures lower system temperatures to 0° C. or below. In some embodiments, active cooling structures lower system temperatures to 77K or below.

FIG. 6 illustrates a cross-sectional view of a low-temperature IC system 400 having scaled bit cells 110 with staggered read and write transistors 120, 130 and parallel, offset read and write channel structures 121, 131 and using die- and package-level active cooling, in accordance with some embodiments. In the example of IC system 400, IC die 602 includes active-cooling structures or components as provided by both die-level microchannels 677 and package-level active-cooling structure 688. IC system 400 includes a lateral surface along the x-y plane that may be defined or taken at any vertical position of IC system 400. The lateral surface of the x-y plane is orthogonal to a vertical or build-up dimension as defined by the z-axis. In some embodiments, IC system 400 may be formed from any substrate material suitable for the fabrication of transistor circuitry. In some embodiments, a semiconductor substrate is used to manufacture read and write transistors 120, 130 and other transistors and components of IC system 400. The semiconductor substrate may include a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as gallium arsenide. The substrate may also include semiconductor materials, metals, dielectrics, dopants, and other materials commonly found in semiconductor substrates.

In FIG. 6, IC system 400 includes an IC die 602, which is a monolithic IC with scaled bit cells 110 as described above, including staggered read and write transistors 120, 130 and read and write channel structures 121, 131, front-side metallization layers 604 (or front-side interconnect layers), and optional back-side metallization layers 605 (or back-side interconnect layers). As shown, transistors 120, 130 are embedded within a dielectric layer 650. As shown, each transistor 120, 130 includes channel structures 121, 131 (e.g., within fins, nanosheets, or nanowires) and gate structures 613. Each of transistors 120, 130 also include source and drain structures, and source and drain contacts, which are not shown in the cross-section of FIG. 6. In some embodiments, front-side metallization layers 604 provide signal routing to transistors 120, 130 and back-side metallization layers 605 provide power delivery, as enabled by through-contacts 614, to transistors 120, 130. In some embodiments, IC system 400 further includes a package-level cooling structure 688, which may be deployed on or over front-side metallization layers 604 (as shown) or on or over a back-side of IC die 602. In some embodiments, package-level cooling structure 688 is coupled to IC die 602 by an adhesion layer 616. IC system 400 may also be deployed without back-side metallization layers 605 shown in FIG. 6. In such embodiments, signal routing and power are provided to transistors 120, 130 via front-side metallization layers 604. However, use of back-side metallization layers 605 may offer advantages.

Transistors 120, 130 are connected and thermally coupled by metallization, e.g., metal heat spreader 644, to the entire metallization structure by through-contacts 614. In this way, transistors 120, 130 are thermally coupled to both the die-level active-cooling structures (of die-level microchannels 677) and package-level active-cooling structure 688.

Interconnectivity of transistors 120, 130 (and other transistors, etc.), signal routing to and from memory arrays, etc., power delivery, etc., and routing to an outside device (not shown), is provided by front-side metallization layers 604, optional back-side metallization layers 605, and package-level interconnects 606. In the example of FIG. 6, package-level interconnects 606 are provided on or over a back-side of IC die 602 as bumps over a passivation layer 655, and IC system 400 is attached to a substrate 444 (and coupled to signal routing, power delivery, etc.) by package-level interconnects 606. However, package-level interconnects 606 may be provided using any suitable interconnect structures such as bond pads, solder bumps, etc. Furthermore, in some embodiments, package-level interconnects 606 are provided on or over a front-side of IC die 602 (i.e., over front-side metallization layers 604) and package-level cooling structure 688 is provided on or over a back-side of IC die 602.

In IC system 400, IC die 602 includes die-level, active-cooling as provided by die-level microchannels 677. Die-level microchannels 677 are to convey a heat transfer fluid therein to remove heat from IC die 602. The heat transfer fluid may be any suitable liquid or gas. In some embodiments, the heat transfer fluid is liquid nitrogen operable to lower the temperature of IC die 602 to a temperature at or below about −196° C. In some embodiments, the heat transfer fluid is a fluid with a cryogenic temperature operating window (e.g., about −180° C. to about −70° C.). In some embodiments, the heat transfer fluid is one of helium-3, helium-4, hydrogen, neon, air, fluorine, argon, oxygen, or methane.

As used herein, the term "microchannels" indicates a channel to convey a heat transfer fluid with the multiple microchannels providing discrete separate channels or a network of channels. Notably, the plural microchannels does not indicate separate channel networks are needed. Such die-level microchannels 677 may be provided in any pattern in the x-y plane such as serpentine patterns, patterns of multiple parallel die-level microchannels 677, or the like. Die-level microchannels 677 couple to a heat exchanger (not shown) that removes heat from and cools the heat transfer fluid before re-introduction to die-level microchannels 677. The flow of fluid within die-level microchannels 677 may be provided by a pump or other fluid flow device. The operation of the heat exchanger, pump, etc. may be controlled by a controller.

In the illustrated embodiment, die-level microchannels 677 are implemented at metallization level M12. In other embodiments, die-level microchannels 677 are implemented over metallization level M12. Die-level microchannels 677 may be formed using any suitable technique or techniques such as patterning and etch techniques to form the void structures of die-level microchannels 677 and passivation or deposition techniques to form a cover structure 678 to enclose the void structures. As shown, in some embodiments, the die-level, active-cooling structure of IC system 400 includes a number of die-level microchannels 677 in IC die 602 and over a number of front-side metallization layers 604. As discussed, die-level microchannels 677 are to convey a heat transfer fluid therein. In some embodiments, a metallization feature 679 of metallization layer M12 is laterally adjacent to die-level microchannels 677. For example, metallization feature 679 may couple to a package-level interconnect structure (not shown) for signal routing for IC die 602. In some embodiments, a passive heat removal device such as a heat sink or the like may be used instead of or in addition to package-level cooling structure 688. In some embodiments, package-level cooling structure 688 is not deployed in IC system 400.

As used herein, the term "metallization layer" describes layers with interconnections or wires that provide electrical routing, generally formed of metal or other electrically and thermally conductive material. Adjacent metallization layers may be formed of different materials and by different methods. Adjacent metallization layers, such as metallization interconnects 651, are interconnected by vias, such as vias 652, that may be characterized as part of the metallization layers or between the metallization layers. As shown, in some embodiments, front-side metallization layers 604 are formed over and immediately adjacent transistors 120, 130. The back-side is then the opposite side, which may be exposed during processing by attaching the front-side to a carrier wafer and exposing the back-side (e.g., by back-side grind or etch operations) as known in the art.

In the illustrated example, front-side metallization layers 604 include M0, V0, M1, M2/V1, M3/V2, M4/V3, and M4-M12. However, front-side metallization layers 604 may include any number of metallization layers such as eight or more metallization layers. Similarly, back-side metallization layers 605 include BM0, BM1, BM2, and BM3. However, back-side metallization layers 605 may include any number of metallization layers such as two to five metallization layers. Front-side metallization layers 604 and back-side metallization layers 605 are embedded within dielectric materials 653, 654. Furthermore, optional metal-insulator-metal (MIM) devices such as diode devices may be provided within back-side metallization layers 605. Other devices such as capacitive memory devices may be provided within front-side metallization layers 604 and/or back-side metallization layers 605.

IC system 400 includes package-level active-cooling structure 688 having package-level microchannels 689. Package-level microchannels 689 are to convey a heat transfer fluid therein to remove heat from IC die 602. The heat transfer fluid may be any suitable liquid or gas as discussed with respect to die-level microchannels 677. Package-level microchannels 689 may be provided in any pattern in the x-y plane such as serpentine patterns, patterns of multiple parallel package-level microchannels 689, etc. Package-level microchannels 689 couple to a heat exchanger (not shown) that removes heat from and cools the heat transfer fluid before re-introduction to package-level microchannels 689. The flow of fluid within package-level microchannels 689 may be provided by a pump or other fluid-flow device. The operation of the heat exchanger, pump, etc. may be controlled by a controller. In the illustrated embodiment, package-level active-cooling structure 688 is a chiller mounted to IC die 602 such that the chiller has a solid body having microchannels therein to convey a heat transfer fluid.

In some embodiments, the heat-removal fluid deployed in die-level microchannels 677 and package-level active-cooling structure 688 are coupled to the same pump and heat exchanger systems. In such embodiments, the heat removal fluid conveyed in both die-level microchannels 677 and package-level active-cooling structure 688 are the same material. Such embodiments may advantageously provide simplicity. In other embodiments, the heat removal fluids are controlled separately. In such embodiments, the heat removal fluids conveyed by die-level microchannels 677 and package-level active-cooling structure 688 may be the same or they may be different. Such embodiments may advantageously provide improved flexibility.

As discussed, IC system 400 includes IC die 602 and optional die-level and package-level active-cooling structures operable to remove heat from IC die 602 to achieve a very low operating temperature of IC die 602. As used herein, the term "very low operating temperature" indicates a temperature at or below 0° C., although even lower temperatures such as an operating temperature at or below −50° C., an operating temperature at or below −70° C., an operating temperature at or below −100° C., an operating temperature at or below −180° C., or an operating temperature at or below −196° C. (e.g., 77K) may be used. In some embodiments, the operating temperature is in a cryogenic temperature operating window (e.g., about −180° C. to about −70° C.). The active-cooling structure may be provided as a package-level structure (i.e., separable from IC die 602), as a die-level structure (i.e., integral to IC die 602), or both. In some embodiments, IC die 602 is deployed in a cold environment, formed using sufficiently conductive materials, etc. and an active-cooling structure is not used.

Figure 7:
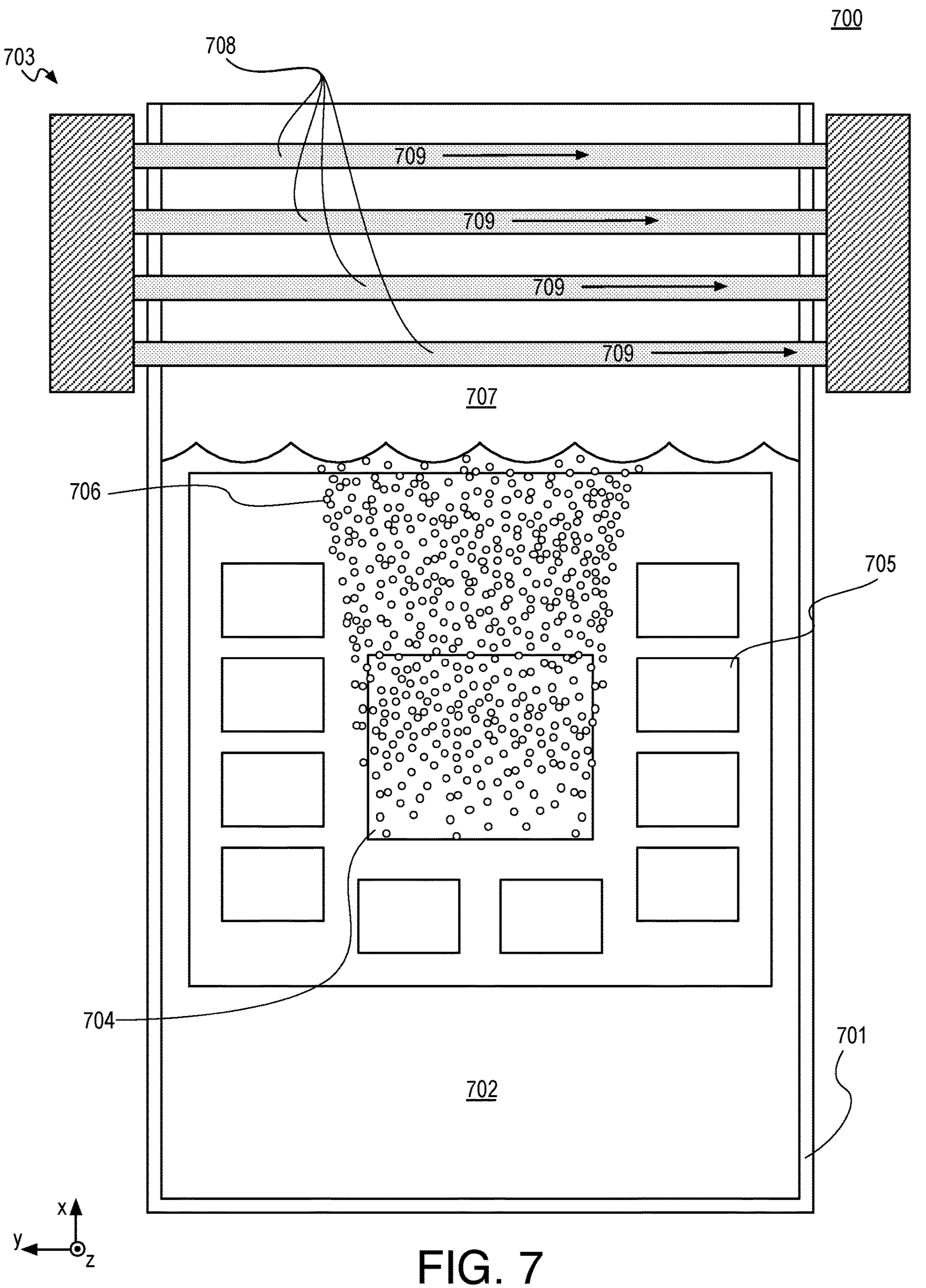
FIG. 7 illustrates a view of an example two-phase immersion cooling system for low-temperature operation of an IC system.

FIG. 7 illustrates a view of an example two-phase immersion cooling system for low-temperature operation of an IC system, in accordance with some embodiments. As shown, two-phase immersion cooling system 700 includes a fluid containment structure 701, a low-boiling point liquid 702 within fluid containment structure 701, and a condensation structure 703 at least partially within fluid containment structure 701. As used herein, the term "low-boiling point liquid" indicates a liquid having a boiling point in the very low temperature ranges discussed. In some embodiments, the low-boiling point liquid is one of helium-3, helium-4, hydrogen, neon, air, fluorine, argon, oxygen, or methane.

In operation, a heat generation source 704, such as an IC package including any of IC dies or systems 100, 400 as discussed herein is immersed in low-boiling point liquid 702. In some embodiments, IC dies or systems 100, 400 as deployed in two-phase immersion cooling system 700 do not include additional active cooling structures, although such die-level or package-level active cooling structures may be used in concert with two-phase immersion cooling system 700. In some embodiments, when deployed in two-phase immersion cooling system 700, package-level active-cooling structure 688 is a heat sink, a heat dissipation plate, a porous heat dissipation plate or the like.

Notably, IC die 602 (or IC die 100), is the source of heat in the context of two-phase immersion cooling system 700. For example, IC die 602 may be packaged and mounted on electronics substrate 705. Electronic substrate 705 may be coupled to a power supply (not shown) and may be partially or completely submerged in low-boiling point liquid 702.

In operation, the heat produced by heat generation source 704 vaporizes low-boiling point liquid 702 as shown in vapor or gas state as bubbles 706, which may collect, due to gravitational forces, above low-boiling point liquid 702 as a vapor portion 707 within fluid containment structure 701. Condensation structure 703 may extend through vapor portion 707. In some embodiments, condensation structure 703 is a heat exchanger having a number of tubes 708 with a cooling fluid (i.e., a fluid colder than the condensation point of vapor portion 707) shown by arrows 709 that may flow through tubes 708 to condense vapor portion 707 back to low-boiling point liquid 702. In the IC system of FIG. 7, package-level active-cooling structure 688 includes a passive cooling structure such as a heat sink for immersion in low-boiling point liquid 702.

Figure 8:
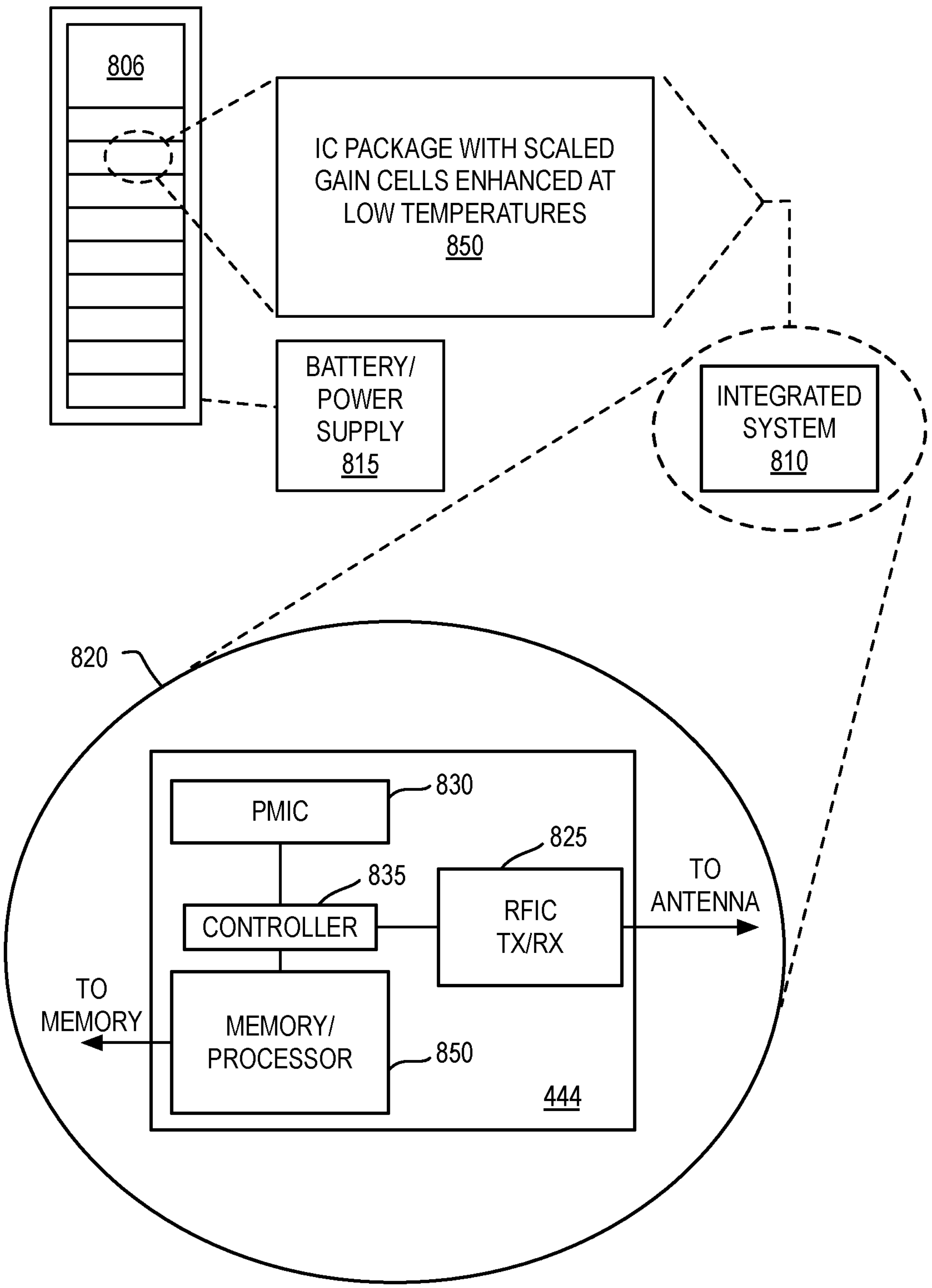
FIG. 8 illustrates a diagram of an example data server machine employing an IC system having scaled bit cells with staggered read and write transistors and offset read and write channel structures.

FIG. 8 illustrates a diagram of an example data server machine employing an IC system having scaled bit cells with staggered read and write transistors and offset read and write channel structures, in accordance with some embodiments. Server machine 806 may be any commercial server, for example, including any number of high-performance computing platforms disposed within a rack and networked together for electronic data processing, which in the exemplary embodiment includes one or more devices 850 having scaled bit cells as discussed herein.

Also as shown, server machine 806 includes a battery and/or power supply 815 to provide power to devices 850, and to provide, in some embodiments, power delivery functions such as power regulation. Devices 850 may be deployed as part of a package-level integrated system 810. Integrated system 810 is further illustrated in the expanded view 820. In the exemplary embodiment, devices 850 (labeled "Memory/Processor") includes at least one memory chip (e.g., with bit cells scaled as discussed herein), and/or at least one processor chip (e.g., a microprocessor, a multi-core microprocessor, or graphics processor, or the like) having the characteristics discussed herein. In an embodiment, device 850 is a microprocessor including scaled bit cells with staggered read and write transistors and offset read and write channel structures as discussed herein. As shown, device 850 may be a multi-chip module employing one or more IC dies with a memory arrays of scaled bit cells as discussed herein. Device 850 may be further coupled to (e.g., communicatively coupled to) a board, an interposer, or other substrate 444 along with, one or more of a power management IC (PMIC) 830, RF (wireless) IC (RFIC) 825, including a wideband RF (wireless) transmitter and/or receiver (TX/RX) (e.g., including a digital baseband and an analog front end module further comprises a power amplifier on a transmit path and a low noise amplifier on a receive path), and a controller 835 thereof. In some embodiments, RFIC 825, PMIC 830, controller 835, and device 850 include IC dies having memory arrays of scaled bit cells as discussed herein on substrate 444 in a multi-chip module.

Figure 9:
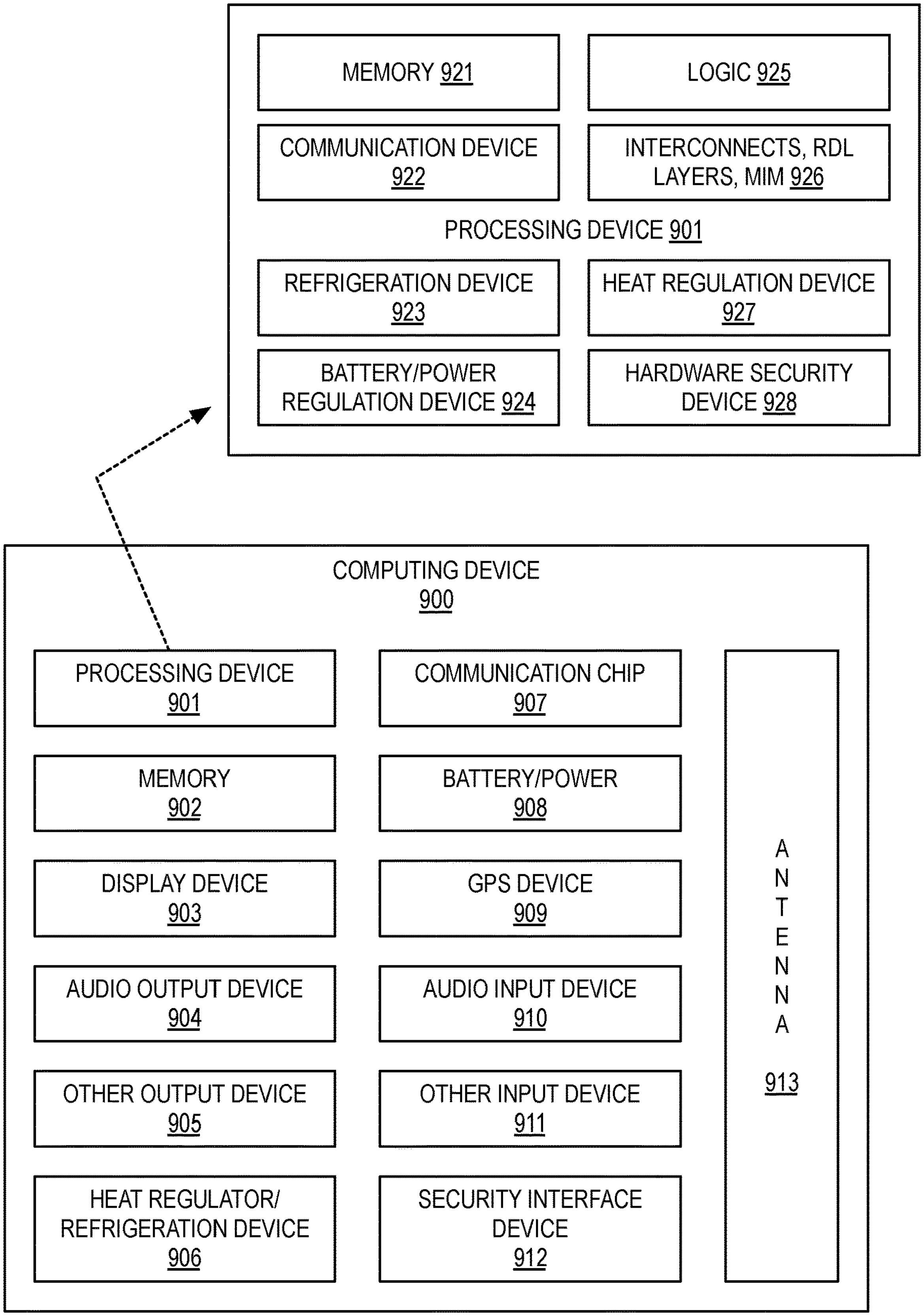
FIG. 9 is a block diagram of an example computing device, all in accordance with some embodiments.

FIG. 9 is a block diagram of an example computing device 900, in accordance with some embodiments. For example, one or more components of computing device 900 may include any of the devices or structures discussed herein. A number of components are illustrated in FIG. 9 as being included in computing device 900, but any one or more of these components may be omitted or duplicated, as suitable for the application. In some embodiments, some or all of the components included in computing device 900 may be attached to one or more printed circuit boards (e.g., a motherboard). In some embodiments, various ones of these components may be fabricated onto a single system-on-a-chip (SoC) die. Additionally, in various embodiments, computing device 900 may not include one or more of the components illustrated in FIG. 9, but computing device 900 may include interface circuitry for coupling to the one or more components. For example, computing device 900 may not include a display device 903, but may include display device interface circuitry (e.g., a connector and driver circuitry) to which display device 903 may be coupled. In another set of examples, computing device 900 may not include an audio output device 904, other output device 905, global positioning system (GPS) device 909, audio input device 910, or other input device 911, but may include audio output device interface circuitry, other output device interface circuitry, GPS device interface circuitry, audio input device interface circuitry, audio input device interface circuitry, to which audio output device 904, other output device 905, GPS device 909, audio input device 910, or other input device 911 may be coupled.

Computing device 900 may include a processing device 901 (e.g., one or more processing devices). As used herein, the term "processing device" or "processor" indicates a device that processes electronic data from registers and/or memory (such as a memory device including memory arrays of scaled bit cells as discussed herein) to transform that electronic data into other electronic data that may be stored in registers and/or memory. Processing device 901 may include a memory 921 (including memory arrays of scaled bit cells as discussed herein), a communication device 922, a refrigeration device 923, a battery/power regulation device 924, logic 925, interconnects 926 (i.e., optionally including redistribution layers (RDL) or metal-insulator-metal (MIM) devices), a heat regulation device 927, and a hardware security device 928.

Processing device 901 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

Computing device 900 may include a memory 902, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 902 includes memory that shares a die with processing device 901. This memory may be used as cache memory and may include embedded dynamic random-access memory (eDRAM) or spin transfer torque magnetic random-access memory (STT-MRAM).

Computing device 900 may include a heat regulation/refrigeration device 906. Heat regulation/refrigeration device 906 may maintain processing device 901 (and/or other components of computing device 900) at a predetermined low temperature during operation. This predetermined low temperature may be any temperature discussed herein.

In some embodiments, computing device 900 may include a communication chip 907 (e.g., one or more communication chips). For example, the communication chip 907 may be configured for managing wireless communications for the transfer of data to and from computing device 900. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 907 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 907 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 907 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 907 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 907 may operate in accordance with other wireless protocols in other embodiments. Computing device 900 may include an antenna 913 to facilitate wireless communications and/or to receive other wireless communications (such as AM or FM radio transmissions).

In some embodiments, communication chip 907 may manage wired communications, such as electrical, optical, or any other suitable communication protocols (e.g., the Ethernet). As noted above, communication chip 907 may include multiple communication chips. For instance, a first communication chip 907 may be dedicated to shorter-range wireless communications such as Wi-Fi or Bluetooth, and a second communication chip 907 may be dedicated to longer-range wireless communications such as GPS, EDGE, GPRS, CDMA, WiMAX, LTE, EV-DO, or others. In some embodiments, a first communication chip 907 may be dedicated to wireless communications, and a second communication chip 907 may be dedicated to wired communications.

Computing device 900 may include battery/power circuitry 908. Battery/power circuitry 908 may include one or more energy storage devices (e.g., batteries or capacitors) and/or circuitry for coupling components of computing device 900 to an energy source separate from computing device 900 (e.g., AC line power).

Computing device 900 may include a display device 903 (or corresponding interface circuitry, as discussed above). Display device 903 may include any visual indicators, such as a heads-up display, a computer monitor, a projector, a touchscreen display, a liquid crystal display (LCD), a light-emitting diode display, or a flat panel display, for example.

Computing device 900 may include an audio output device 904 (or corresponding interface circuitry, as discussed above). Audio output device 904 may include any device that generates an audible indicator, such as speakers, headsets, or earbuds, for example.

Computing device 900 may include an audio input device 910 (or corresponding interface circuitry, as discussed above). Audio input device 910 may include any device that generates a signal representative of a sound, such as microphones, microphone arrays, or digital instruments (e.g., instruments having a musical instrument digital interface (MIDI) output).

Computing device 900 may include a GPS device 909 (or corresponding interface circuitry, as discussed above). GPS device 909 may be in communication with a satellite-based system and may receive a location of computing device 900, as known in the art.

Computing device 900 may include other output device 905 (or corresponding interface circuitry, as discussed above). Examples of the other output device 905 may include an audio codec, a video codec, a printer, a wired or wireless transmitter for providing information to other devices, or an additional storage device.

Computing device 900 may include other input device 911 (or corresponding interface circuitry, as discussed above). Examples of the other input device 911 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 900 may include a security interface device 912. Security interface device 912 may include any device that provides security measures for computing device 900 such as intrusion detection, biometric validation, security encode or decode, access list management, malware detection, or spyware detection.

Computing device 900, or a subset of its components, may have any appropriate form factor, such as a hand-held or mobile computing device (e.g., a cell phone, a smart phone, a mobile internet device, a music player, a tablet computer, a laptop computer, a netbook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The subject matter of the present description is not necessarily limited to specific applications illustrated in FIGS. 1-9. The subject matter may be applied to other deposition applications, as well as any appropriate manufacturing application, as will be understood to those skilled in the art.

The following examples pertain to further embodiments, and specifics in the examples may be used anywhere in one or more embodiments.

In one or more first embodiments, a memory device comprises an array of bit cells, wherein individual ones of the bit cells comprise a first transistor comprising a first channel region coupled to a first gate, wherein the first channel region extends in a first direction, and a second transistor comprising a second channel region substantially parallel to the first channel region, wherein a first end of the second channel region is coupled to the first gate, and a read bitline and a write bitline, wherein the read and write bitlines are parallel and extend in a second direction, wherein a first bit cell and a second bit cell are on opposite sides of the read bitline, the second bit cell and a third bit cell are on opposite sides of the write bitline, the first channel regions of the first and second bit cells are within a first channel structure coupled to the read bitline, and the second channel regions of the second and third bit cells are within a second channel structure coupled to the write bitline.

In one or more second embodiments, further to the first embodiments, the second direction is substantially orthogonal to the first direction.

In one or more third embodiments, further to the first or second embodiments, the first transistors on opposing sides of the read bitline or the second transistors on opposing sides of the write bitline share a substantially vertical fin, and the substantially vertical fin comprises corresponding ones of the first or second channel regions.

In one or more fourth embodiments, further to the first through third embodiments, the first transistors on opposing sides of the read bitline or the second transistors on opposing sides of the write bitline share a nanowire or nanosheet, and the nanowire or nanosheet comprises corresponding ones of the first or second channel regions.

In one or more fifth embodiments, further to the first through fourth embodiments, for an individual one of the bit cells, a first end of the first channel region is electrically connected to a read wordline, a second end of the first channel region is electrically connected to the read bitline, the inner end of the second channel region is electrically connected to the first gate, an outer end of the second channel region is electrically connected to the write bitline, and the second transistor comprises a second gate, wherein the second channel region is coupled to the second gate, and the second gate is electrically connected to a write wordline.

In one or more sixth embodiments, further to the first through fifth embodiments, the first or second transistors are p-type transistors, and the second or first transistors are n-type transistors.

In one or more seventh embodiments, further to the first through sixth embodiments, the first and second channel regions are in vertically adjacent layers of an IC die.

In one or more eighth embodiments, further to the first through seventh embodiments, the first or second channel regions are on a front side of the IC die, and the second or first channel regions are on a back side of the IC die.

In one or more ninth embodiments, an IC system comprises a power supply coupled to an IC die, the IC die comprising an array of bit cells, wherein individual ones of the bit cells comprise a read transistor comprising a first channel region coupled to a first gate, wherein the first channel region extends in a first direction, and a write transistor comprising a second channel region substantially parallel to the first channel region, wherein an inner end of the second channel region is coupled to the first gate, and a read bitline and a write bitline, the read and write bitlines parallel and extending in a second direction, wherein a first bit cell and a second bit cell are on opposite sides of the read bitline, the second bit cell and a third bit cell are on opposite sides of the write bitline, the first channel regions of the first and second bit cells are collinear and coupled to the read bitline, and the second channel regions of the second and third bit cells are collinear and coupled to the write bitline.

In one or more tenth embodiments, further to the ninth embodiments, the second direction is substantially orthogonal to the first direction.

In one or more eleventh embodiments, further to the ninth or tenth embodiments, the first or second channel regions are comprised within substantially vertical fins.

In one or more twelfth embodiments, further to the ninth through eleventh embodiments, the first or second channel regions are comprised within nanowires or nanosheets.

In one or more thirteenth embodiments, further to the ninth through twelfth embodiments, the first and second channel regions are in vertically adjacent layers of the IC die.

In one or more fourteenth embodiments, further to the ninth through thirteenth embodiments, the first or second channel regions are on a front side of the IC die, and the second or first channel regions are on a back side of the IC die.

In one or more fifteenth embodiments, further to the ninth through fourteenth embodiments, the first and second channels are within a substantially horizontal layer of the IC die.

In one or more sixteenth embodiments, further to the ninth through fifteenth embodiments, the IC system comprises or is thermally coupled to a cooling structure, the cooling structure operable to remove heat from the IC die to achieve an operating temperature at or below 0° C.

In one or more seventeenth embodiments, further to the ninth through sixteenth embodiments, an individual one of the first or second channel regions has a thickness of not more than 2 nm.

In one or more eighteenth embodiments, a method comprises receiving a base substrate with a first set of channel structures, the first set of channel structures collinear and extending in a first direction, forming a second set of channel structures, wherein the second set of channel structures are collinear, the second set of channel structures parallel to and offset in the first direction from the first set of channel structures, and forming conductive structures comprising first bitlines and second bitlines, the first and second bitlines parallel and extending in a second direction, the second direction substantially orthogonal to the first direction, wherein the first bitlines couple to the first set of channel structures and the second bitlines couple to the second set of channel structures.

In one or more nineteenth embodiments, further to the eighteenth embodiments, the first set of channel structures and the second set of channel structures are in vertically adjacent layers of the base substrate.

In one or more twentieth embodiments, further to the eighteenth or nineteenth embodiments, the second set of channel structures are on a back side of the base substrate.

In one or more twenty-first embodiments, further to the eighteenth through twentieth embodiments, forming the second set of channel structures comprises receiving a second substrate and transferring a layer of semiconductor material from the second substrate to the back side of the base substrate.

In one or more twenty-second embodiments, further to the eighteenth through twenty-first embodiments, forming the second set of channel structures comprises depositing a thin film of semiconductor material over the base substrate.

The disclosure can be practiced with modification and alteration, and the scope of the appended claims is not limited to the embodiments so described. For example, the above embodiments may include specific combinations of features. However, the above embodiments are not limiting in this regard and, in various implementations, the above embodiments may include the undertaking only a subset of such features, undertaking a different order of such features, undertaking a different combination of such features, and/or undertaking additional features than those features explicitly listed. The scope of the patent rights should, therefore, be determined with reference to the appended claims, along with the full scope of equivalents to which such claims are entitled.

We claim:

1. A memory device, comprising:

an array of bit cells, wherein individual ones of the bit cells comprise:

a first transistor comprising a first channel region coupled to a first gate, wherein the first channel region extends in a first direction; and a second transistor comprising a second channel region substantially parallel to the first channel region, wherein a first end of the second channel region is coupled to the first gate, and wherein the first and second channel regions are in vertically adjacent layers of an integrated circuit (IC) die; and a read bitline and a write bitline, wherein the read and write bitlines are parallel and extend in a second direction, wherein a first bit cell and a second bit cell are on opposite sides of the read bitline, the second bit cell and a third bit cell are on opposite sides of the write bitline, the first channel regions of the first and second bit cells are within a first channel structure coupled to the read bitline, and the second channel regions of the second and third bit cells are within a second channel structure coupled to the write bitline.

2. The memory device of claim 1, wherein the second direction is substantially orthogonal to the first direction.

3. The memory device of claim 1, wherein the first transistors on opposing sides of the read bitline or the second transistors on opposing sides of the write bitline share a substantially vertical fin, and the substantially vertical fin comprises corresponding ones of the first or second channel regions.

4. The memory device of claim 1, wherein the first transistors on opposing sides of the read bitline or the second transistors on opposing sides of the write bitline share a nanowire or nanosheet, and the nanowire or nanosheet comprises corresponding ones of the first or second channel regions.

5. The memory device of claim 1, wherein, for an individual one of the bit cells:

a first end of the first channel region is electrically connected to a read wordline;

a second end of the first channel region is electrically connected to the read bitline;

the second end of the second channel region is electrically connected to the first gate;

an outer end of the second channel region is electrically connected to the write bitline; and the second transistor comprises a second gate, wherein the second channel region is coupled to the second gate, and the second gate is electrically connected to a write wordline.

6. The memory device of claim 1, wherein the first or second transistors are p-type transistors, and the second or first transistors are n-type transistors.

7. The memory device of claim 1, wherein the first or second channel regions are on a front side of the IC die, and the second or first channel regions are on a back side of the IC die.

8. An integrated circuit (IC) system, comprising:

a power supply coupled to an IC die, the IC die comprising:

an array of bit cells, wherein individual ones of the bit cells comprise:

a read transistor comprising a first channel region coupled to a first gate, wherein the first channel region extends in a first direction; and a write transistor comprising a second channel region substantially parallel to the first channel region, wherein an inner end of the second channel region is coupled to the first gate, and wherein the first and second channel regions are in vertically adjacent layers of the IC die; and a read bitline and a write bitline, the read and write bitlines parallel and extending in a second direction, wherein a first bit cell and a second bit cell are on opposite sides of the read bitline, the second bit cell and a third bit cell are on opposite sides of the write bitline, the first channel regions of the first and second bit cells are collinear and coupled to the read bitline, and the second channel regions of the second and third bit cells are collinear and coupled to the write bitline.

9. The IC system of claim 8, wherein the second direction is substantially orthogonal to the first direction.

10. The IC system of claim 8, wherein the first or second channel regions are comprised within substantially vertical fins.

11. The IC system of claim 8, wherein the first or second channel regions are comprised within nanowires or nanosheets.

12. The IC system of claim 8, wherein the first or second channel regions are on a front side of the IC die, and the second or first channel regions are on a back side of the IC die.

13. The IC system of claim 8, wherein the IC system comprises or is thermally coupled to a cooling structure, the cooling structure operable to remove heat from the IC die to achieve an operating temperature at or below 0° C.

14. The IC system of claim 13, wherein an individual one of the first or second channel regions has a thickness of not more than 2 nm.

15. A method, comprising:

receiving a base substrate with a first set of channel structures, the first set of channel structures collinear and extending in a first direction;

forming a second set of channel structures, wherein the second set of channel structures are collinear, the second set of channel structures are parallel to and offset in the first direction from the first set of channel structures, and the first set of channel structures and the second set of channel structures are in vertically adjacent layers of the base substrate; and forming conductive structures comprising first bitlines and second bitlines, the first and second bitlines parallel and extending in a second direction, the second direction substantially orthogonal to the first direction, wherein the first bitlines couple to the first set of channel structures and the second bitlines couple to the second set of channel structures.

16. The method of claim 15, wherein the second set of channel structures are on a back side of the base substrate.

17. The method of claim 16, wherein forming the second set of channel structures comprises receiving a second substrate and transferring a layer of semiconductor material from the second substrate to the back side of the base substrate.

18. The method of claim 15, wherein forming the second set of channel structures comprises depositing a thin film of semiconductor material over the base substrate.

19. The method of claim 15, wherein the first and second sets of channel structures comprise vertical fins, nanowires, or nanosheets.

20. The memory device of claim 1, further comprising a power supply coupled to the IC die.

21. The memory device of claim 1, further comprising a cooling structure operable to remove heat from the IC die.

22. The memory device of claim 21, wherein the cooling structure is operable to remove heat from the IC die to achieve an operating temperature at or below 0° C.

* * * * *